United States Patent
Jang

(10) Patent No.: US 8,103,917 B2
(45) Date of Patent: Jan. 24, 2012

(54) CIRCUIT AND METHOD FOR CORRECTING SKEW IN A PLURALITY OF COMMUNICATION CHANNELS FOR COMMUNICATING WITH A MEMORY DEVICE, MEMORY CONTROLLER, SYSTEM AND METHOD USING THE SAME, AND MEMORY TEST SYSTEM AND METHOD USING THE SAME

(75) Inventor: Young-Chan Jang, Yongin-si (KR)

(73) Assignee: Samsung Electronics Co., Ltd. (KR)

( * ) Notice: Subject to any disclaimer, the term of this patent is extended or adjusted under 35 U.S.C. 154(b) by 105 days.

(21) Appl. No.: 12/592,271

(22) Filed: Nov. 20, 2009

(65) Prior Publication Data

US 2010/0153792 A1 Jun. 17, 2010

(30) Foreign Application Priority Data

Dec. 15, 2008 (KR) ........................ 10-2008-0127103

(51) Int. Cl.
*G11B 20/20* (2006.01)
*G11C 29/00* (2006.01)

(52) U.S. Cl. ........................ 714/700; 714/718

(58) Field of Classification Search .................. 714/700, 714/718

See application file for complete search history.

(56) References Cited

U.S. PATENT DOCUMENTS

| 6,820,234 | B2 * | 11/2004 | Deas et al. ..................... 714/814 |
| 7,343,533 | B2 * | 3/2008 | Lee et al. ...................... 714/718 |
| 2003/0081709 | A1 | 5/2003 | Ngo et al. |
| 2006/0109869 | A1 * | 5/2006 | Jakobs et al. ................. 370/508 |
| 2007/0047667 | A1 * | 3/2007 | Shumarayev ................. 375/295 |
| 2007/0118251 | A1 | 5/2007 | Tseng et al. |
| 2007/0240008 | A1 * | 10/2007 | Ando ............................ 713/400 |

OTHER PUBLICATIONS

Loeb, M.L.; Stilwell, G.R., Jr.; , "An algorithm for bit-skew correction in byte-wide WDM optical fiber systems," Lightwave Technology, Journal of , vol. 8, No. 2, pp. 239-242, Feb. 1990 doi: 10.1109/50.47877 URL: http://ieeexplore.ieee.org/stamp/stamp.jsp?tp=&arnumber=47877&isnumber=1803.*

Blaum, M.; Bruck, J.; , "Coding for Simultaneous Correction and Detection of Skew in Parallel," Information Theory, 1993. Proceedings. 1993 IEEE International Symposium on , vol., no., pp. 294, Jan. 17-22, 1993 doi: 10.1109/ISIT.1993.748608 URL: http://ieeexplore.ieee.org/stamp/stamp.jsp?tp=&arnumber=748608&isnumber=14996.*

* cited by examiner

*Primary Examiner* — Cynthia Britt
(74) *Attorney, Agent, or Firm* — Onello & Mello, LLP

(57) ABSTRACT

In a circuit and method for correcting skew among a plurality of communication channels used in communicating with a memory circuit, and in a memory controller and memory controlling method, and in a memory system and method, the circuit for correcting skew includes a transmitting circuit for transmitting a reference signal to input ends of the plurality of channels and through the plurality of channels, and a plurality of receiving circuits for receiving at the input ends of the plurality of channels a respective plurality of reflected signals, the reflected signals being reflected from respective output ends of the plurality of channels. A detection circuit receives the reflected signals and detects relative signal propagation time differences between the plurality of channels. A delay circuit coupled to at least one of the channels sets a signal propagation delay in the at least one of the channels based on the detected relative signal propagation time differences.

20 Claims, 33 Drawing Sheets

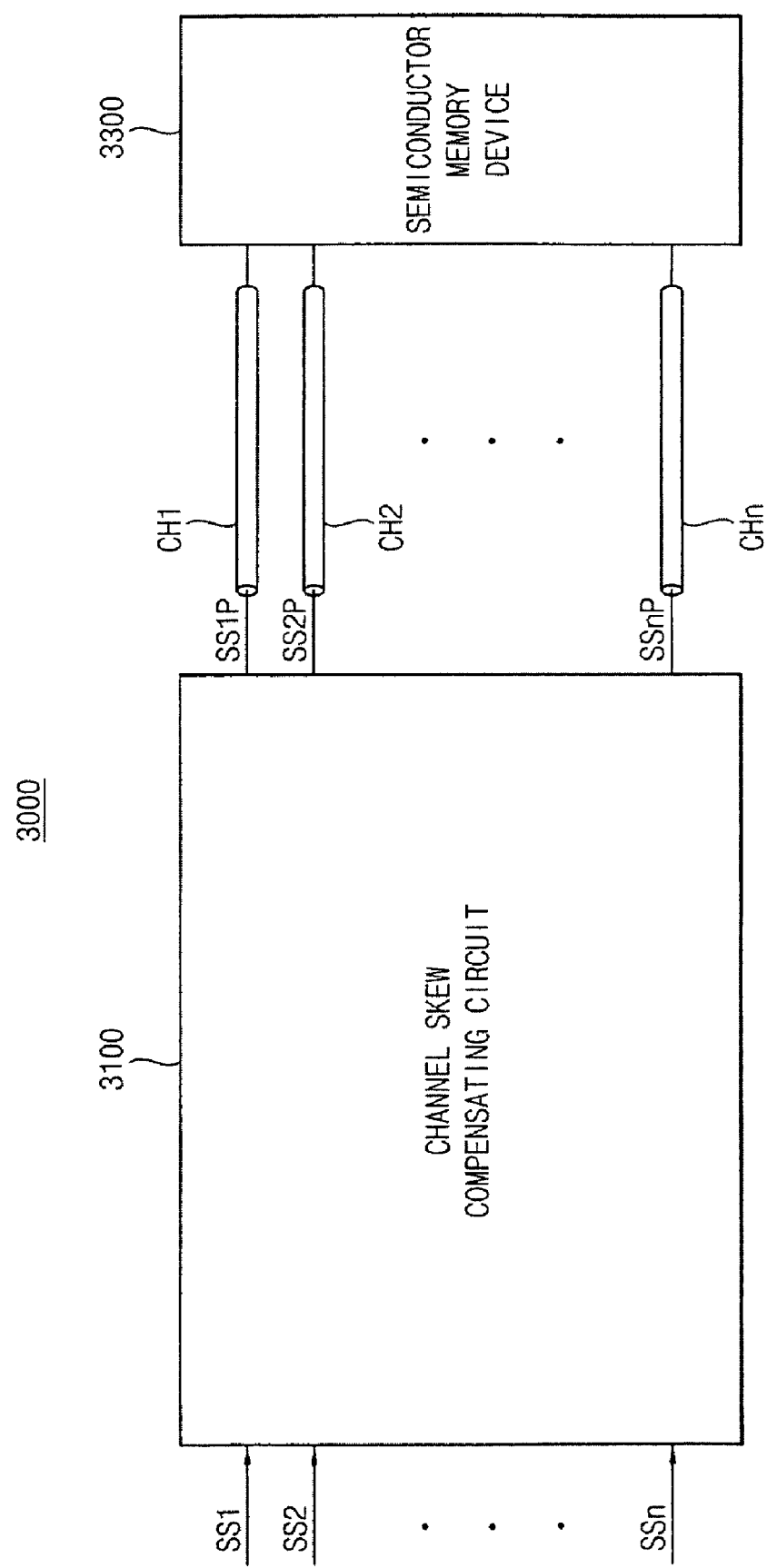

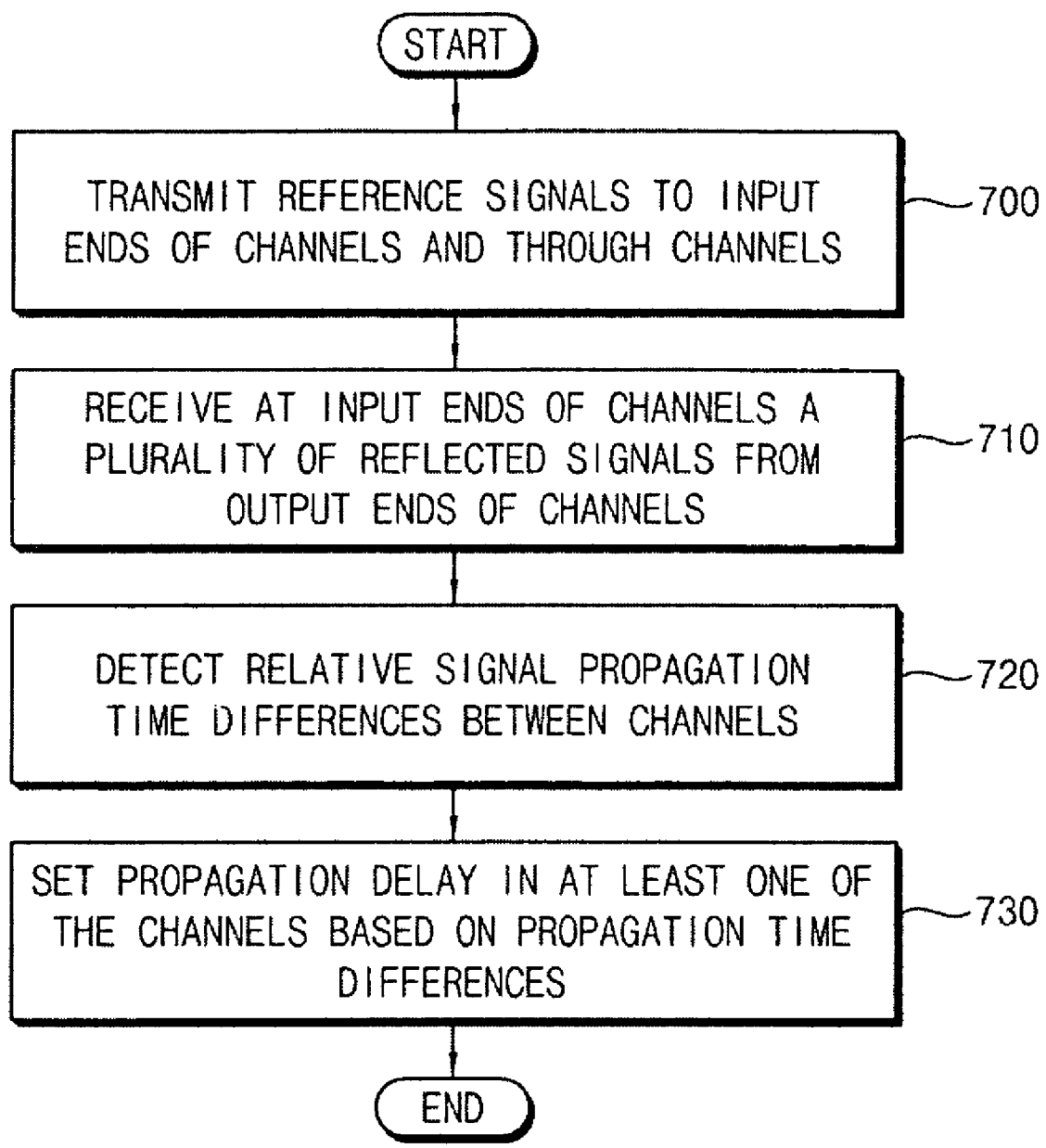

US 8,103,917 B2

CIRCUIT AND METHOD FOR CORRECTING SKEW IN A PLURALITY OF COMMUNICATION CHANNELS FOR COMMUNICATING WITH A MEMORY DEVICE, MEMORY CONTROLLER, SYSTEM AND METHOD USING THE SAME, AND MEMORY TEST SYSTEM AND METHOD USING THE SAME

RELATED APPLICATION

This application relies for priority under 35 U.S.C. 119(a) on Korean Patent Application number 10-2008-0127103, filed in the Korean Intellectual Property Office on Dec. 15, 2008, the entire contents of which are incorporated herein by reference.

BACKGROUND

1. Field of the Invention

This application relates to memory circuits and systems, memory controller circuits and systems and memory testing circuits and systems, and, more particularly, to memory circuits and systems, memory controller circuits and systems and memory testing circuits and systems in which skew among multiple communication channels is substantially reduced or eliminated.

2. Description of the Related Art

In the fabrication of memory circuits and devices, it is necessary to test the memory circuit or device. This is typically accomplished using automatic test equipment (ATE) coupled to the memory circuit or device, i.e., the device under test (DUT). The ATE generates and transmits certain predetermined test signals to the DUT and receives response signals from the DUT and evaluates the DUT based on the responses.

FIG. 1 is a schematic block diagram of a typical test system 10. The test system 10 includes the ATE 12 and the DUT 14. Because of the high speed and complexity of memory circuits, the ATE 12 typically does not interface directly with the memory circuit DUT 14. A specialized test circuit 16 is typically interposed between the ATE 12 and the DUT 14. The test circuit 16 operates under the control of the ATE 12 to format test signals, forward the test signals to the DUT 14, receive the response signals from the DUT 14 and generate and forward test result information to the ATE 12. The test circuit 16 can be referred to as a built-off-test chip (BOT), meaning that it can be configured as a separate circuit off of the chip of the memory circuit DUT 14 and separated from the ATE 12.

The test circuit 16 communicates with the DUT over an interface 18, which includes a plurality of channels, generically identified by 20a, 20b, 20c, . . . , 20n. The test control signals, test data, DUT response signals, etc., used in testing the DUT 14 are transferred back-and-forth over the interface 18.

Due to variation in actual or effective length of the channels 20a, 20b, 20c 20d, signal propagation times among the channels are different. This "skew" in the propagation times can introduce errors in the process of testing the DUT. This is especially true in high-speed memory circuits, such as DDR3 DRAM memory circuits. In fact, at such high-speed operation, because of the channel skew, the control and data signals transferred between the test circuit 16 and the DUT 14 may not satisfy the specified DDR3 control and data signal requirements, making testing of the DDR3 memory circuit difficult or impossible.

SUMMARY

The present inventive concept obviates one or more limitations of the prior art by reducing or eliminating skew among channels used to communicate with a high-speed memory circuit, for example, a DDR3 DRAM memory circuit. The inventive concept can be applied to a test circuit used in testing the memory circuit and/or a memory controller used in controlling the memory circuit and/or a memory system using the memory circuit.

According to a first aspect, the inventive concept is directed to a circuit for correcting skew among a plurality of communication channels used in communicating with a memory circuit. The circuit includes a transmitting circuit for transmitting a reference signal to input ends of the plurality of channels and through the plurality of channels, and a plurality of receiving circuits for receiving at the input ends of the plurality of channels a respective plurality of reflected signals, the reflected signals being reflected from respective output ends of the plurality of channels. A detection circuit receives the reflected signals and detects relative signal propagation time differences between the plurality of channels. A delay circuit coupled to at least one of the channels sets a signal propagation delay in the at least one of the channels based on the detected relative signal propagation time differences.

In some embodiments, the circuit further comprises a plurality of delay circuits coupled to a plurality of the channels for setting a plurality of signal propagation delays in the plurality of channels based on the detected relative signal propagation time differences.

In some embodiments, the reference signal is a step signal.

In some embodiments, the circuit is a built-off-test circuit used in sending test signals to the memory circuit.

In some embodiments, the circuit is a memory controller circuit for controlling the memory circuit.

In some embodiments, the memory circuit is a device under test (DUT). In some embodiments, the memory circuit is a DRAM memory circuit undergoing a test. In some embodiments, the memory circuit is a DDR3 DRAM memory circuit undergoing a test.

In some embodiments, the memory circuit is a DRAM memory circuit. In some embodiments, the memory circuit is a DDR3 DRAM memory circuit.

In some embodiments, one of the plurality of channels is a channel for communicating a DQS data strobe signal. In some embodiments, the delay circuit is set such that a phase shift of 90 degrees is introduced in the channel for communicating the DQS data strobe signal. In some embodiments, one of the plurality of channels is a channel for communicating a DQ data signal.

In some embodiments, one of the plurality of channels is a channel for communicating a DQ data signal.

In some embodiments, the delay circuit is a delay line. In some embodiments, the delay circuit is a programmable delay line. In some embodiments, the delay circuit is an asynchronous programmable delay line.

In some embodiments, the transmitting circuit comprises a source termination circuit for terminating the input ends of the channels. In some embodiments, the output ends of the channels are configured as open circuits when the signals are transmitted through the channels. In some embodiments, the output ends of the channels are disconnected from the memory circuit when the signals are transmitted through the channels. In some embodiments, an on-die-termination (ODT) circuit in the memory circuit at the output ends of the channels is controlled such that the output ends of the channels are configured as open circuits.

According to another aspect, the inventive concept is directed to a memory controller for controlling a memory circuit, the memory controller having a de-skewing capability for correcting skew among a plurality of communication channels used in communicating with the memory circuit. The memory controller includes a transmitting circuit for transmitting a reference signal to input ends of the plurality of channels and through the plurality of channels, and a plurality of receiving circuits for receiving at the input ends of the plurality of channels a respective plurality of reflected signals, the reflected signals being reflected from respective output ends of the plurality of channels. A detection circuit receives the reflected signals and detects relative signal propagation time differences between the plurality of channels. A delay circuit is coupled to at least one of the channels for setting a signal propagation delay in the at least one of the channels based on the detected signal propagation time differences.

In some embodiments, the memory controller further comprises a plurality of delay circuits coupled to a plurality of the channels for setting a plurality of signal propagation delays in the plurality of channels based on the detected signal propagation time differences.

In some embodiments, the reference signal is a step signal.

In some embodiments, the memory circuit is a DRAM memory circuit. In some embodiments, the memory circuit is a DDR3 DRAM memory circuit.

In some embodiments, one of the plurality of channels is a channel for communicating a DQS data strobe signal. In some embodiments, the delay circuit is set such that a phase shift of 90 degrees is introduced in the channel for communicating the DQS data strobe signal. In some embodiments, one of the plurality of channels is a channel for communicating a DQ data signal.

In some embodiments, one of the plurality of channels is a channel for communicating a DQ data signal.

In some embodiments, the delay circuit is a delay line. In some embodiments, the delay circuit is a programmable delay line. In some embodiments, the delay circuit is an asynchronous programmable delay line.

In some embodiments, the transmitting circuit comprises a source termination circuit for terminating the input ends of the channels. In some embodiments, the output ends of the channels are configured as open circuits when the signals are transmitted through the channels. In some embodiments, the output ends of the channels are disconnected from the memory circuit when the signals are transmitted through the channels. In some embodiments, an on-die-termination (ODT) circuit in the memory circuit at the output ends of the channels is controlled such that the output ends of the channels are configured as open circuits.

According to another aspect, the inventive concept is directed to a memory system, which includes a memory circuit and a memory controller. The memory controller is coupled to the memory circuit for controlling the memory circuit and has a de-skewing capability for correcting skew among a plurality of communication channels used in communicating with the memory circuit. The memory controller includes a transmitting circuit for transmitting a reference signal to input ends of the plurality of channels and through the plurality of channels and a plurality of receiving circuits for receiving at the input ends of the plurality of channels a respective plurality of reflected signals, the reflected signals being reflected from respective output ends of the plurality of channels. A detection circuit receives the reflected signals and detects relative signal propagation time differences between the plurality of channels. A delay circuit is coupled to at least one of the channels for setting a signal propagation delay in the at least one of the channels based on the detected signal propagation time differences.

In some embodiments, the memory controller further comprises a plurality of delay circuits coupled to a plurality of the channels for setting a plurality of signal propagation delays in the plurality of channels based on the detected signal propagation time differences.

In some embodiments, the reference signal is a step signal.

In some embodiments, the memory circuit is a DRAM memory circuit. In some embodiments, the memory circuit is a DDR3 DRAM memory circuit.

In some embodiments, one of the plurality of channels is a channel for communicating a DQS data strobe signal. In some embodiments, the delay circuit is set such that a phase shift of 90 degrees is introduced in the channel for communicating the DQS data strobe signal. In some embodiments, one of the plurality of channels is a channel for communicating a DQ data signal.

In some embodiments, one of the plurality of channels is a channel for communicating a DQ data signal.

In some embodiments, the delay circuit is a delay line. In some embodiments, the delay circuit is a programmable delay line. In some embodiments, the delay circuit is an asynchronous programmable delay line.

In some embodiments, the transmitting circuit comprises a source termination circuit for terminating the input ends of the channels. In some embodiments, the output ends of the channels are configured as open circuits when the signals are transmitted through the channels. In some embodiments, the output ends of the channels are disconnected from the memory circuit when the signals are transmitted through the channels. In some embodiments, an on-die-termination (ODT) circuit in the memory circuit at the output ends of the channels is controlled such that the output ends of the channels are configured as open circuits.

According to another aspect, the inventive concept is directed to a method for correcting skew among a plurality of communication channels used in communicating with a memory circuit. According to the method, a reference signal is transmitted to input ends of the plurality of channels and through the plurality of channels. A respective plurality of reflected signals are received at the input ends of the plurality of channels, the reflected signals being reflected from respective output ends of the plurality of channels. Relative signal propagation time differences between the plurality of channels are detected. A signal propagation delay is set in at least one of the channels based on the detected relative signal propagation time differences.

In some embodiments, the method further comprises setting a plurality of signal propagation delays in the plurality of channels based on the detected relative signal propagation time differences.

In some embodiments, the reference signal is a step signal.

In some embodiments, the method further comprises sending test signals to the memory circuit.

In some embodiments, the method further comprises controlling the memory circuit.

In some embodiments, the memory circuit is a device under test (DUT). In some embodiments, the memory circuit is a DRAM memory circuit undergoing a test. In some embodiments, the memory circuit is a DDR3 DRAM memory circuit undergoing a test.

In some embodiments, the memory circuit is a DRAM memory circuit. In some embodiments, the memory circuit is a DDR3 DRAM memory circuit.

In some embodiments, one of the plurality of channels is a channel for communicating a DQS data strobe signal. In some embodiments, the signal propagation delay is set such that a phase shift of 90 degrees is introduced in the channel for communicating the DQS data strobe signal. In some embodiments, one of the plurality of channels is a channel for communicating a DQ data signal.

In some embodiments, one of the plurality of channels is a channel for communicating a DQ data signal.

In some embodiments, the signal propagation delay is set by a delay line. In some embodiments, the signal propagation delay is set by a programmable delay line. In some embodiments, the signal propagation delay is set by an asynchronous programmable delay line.

In some embodiments, the method further comprises providing a source termination circuit for terminating the input ends of the channels. In some embodiments, the output ends of the channels are configured as open circuits when the signals are transmitted through the channels. In some embodiments, the output ends of the channels are disconnected from the memory circuit when the signals are transmitted through the channels. In some embodiments, an on-die-termination (ODT) circuit in the memory circuit at the output ends of the channels is controlled such that the output ends of the channels are configured as open circuits.

According to another aspect, the inventive concept is directed to a method for controlling a memory circuit, the method including correcting skew among a plurality of communication channels used in communicating with the memory circuit. According to the method, a reference signal is transmitted to input ends of the plurality of channels and through the plurality of channels, and a respective plurality of reflected signals are received at the input ends of the plurality of channels, the reflected signals being reflected from respective output ends of the plurality of channels. Relative signal propagation time differences between the plurality of channels are detected. A signal propagation delay is set in the at least one of the channels based on the detected relative signal propagation time differences.

In some embodiments, the method further comprises setting a plurality of signal propagation delays in the plurality of channels based on the detected relative signal propagation time differences.

In some embodiments, the reference signal is a step signal.

In some embodiments, the memory circuit is a DRAM memory circuit. In some embodiments, the memory circuit is a DDR3 DRAM memory circuit.

In some embodiments, one of the plurality of channels is a channel for communicating a DQS data strobe signal. In some embodiments, the signal propagation delay is set such that a phase shift of 90 degrees is introduced in the channel for communicating the DQS data strobe signal. In some embodiments, one of the plurality of channels is a channel for communicating a DQ data signal.

In some embodiments, one of the plurality of channels is a channel for communicating a DQ data signal.

In some embodiments, the signal propagation delay is set by a delay line. In some embodiments, the signal propagation delay is set by a programmable delay line. In some embodiments, the signal propagation delay is set by an asynchronous programmable delay line.

In some embodiments, the method further comprises providing a source termination circuit for terminating the input ends of the channels. In some embodiments, the output ends of the channels are configured as open circuits when the signals are transmitted through the channels. In some embodiments, the output ends of the channels are disconnected from the memory circuit when the signals are transmitted through the channels. In some embodiments, an on-die-termination (ODT) circuit in the memory circuit at the output ends of the channels is controlled such that the output ends of the channels are configured as open circuits.

According to another aspect, the inventive concept is directed to a memory system method, which includes providing a memory circuit and providing a memory controller coupled to the memory circuit for controlling the memory circuit, the memory controller having a de-skewing capability for correcting skew among a plurality of communication channels used in communicating with the memory circuit. The memory controller: (a) transmits a reference signal to input ends of the plurality of channels and through the plurality of channels, (b) receives at the input ends of the plurality of channels a respective plurality of reflected signals, the reflected signals being reflected from respective output ends of the plurality of channels, (c) detects relative signal propagation time differences between the plurality of channels, and (d) sets a signal propagation delay in the at least one of the channels based on the detected relative signal propagation time differences.

In some embodiments, the memory sets a plurality of signal propagation delays in the plurality of channels based on the detected relative signal propagation time differences.

In some embodiments, the reference signal is a step signal.

In some embodiments, the memory circuit is a DRAM memory circuit. In some embodiments, the memory circuit is a DDR3 DRAM memory circuit.

In some embodiments, one of the plurality of channels is a channel for communicating a DQS data strobe signal. In some embodiments, the signal propagation delay is set such that a phase shift of 90 degrees is introduced in the channel for communicating the DQS data strobe signal. In some embodiments, one of the plurality of channels is a channel for communicating a DQ data signal.

In some embodiments, one of the plurality of channels is a channel for communicating a DQ data signal.

In some embodiments, the signal propagation delay is set by a delay line. In some embodiments, the signal propagation delay is set by a programmable delay line. In some embodiments, the signal propagation delay is set by an asynchronous programmable delay line.

In some embodiments, the method further comprises providing a source termination circuit for terminating the input ends of the channels. In some embodiments, the output ends of the channels are configured as open circuits when the signals are transmitted through the channels. In some embodiments, the output ends of the channels are disconnected from the memory circuit when the signals are transmitted through the channels. In some embodiments, an on-die-termination (ODT) circuit in the memory circuit at the output ends of the channels is controlled such that the output ends of the channels are configured as open circuits.

According to another aspect, the inventive concept is directed to a method for adjusting delay among first and second communication channels, the method comprising: transmitting a first signal from a transmit end of the first communication channel to a receive end of the first communication channel; transmitting a second signal from a transmit end of the second communication channel to a receive end of the second communication channel; receiving a signal indicative of receipt of a reflected version of the first signal at the transmit end of the first communication channel; and using the signal indicative of receipt of the reflected version of the first signal at the transmit end of the first communication channel, sampling a signal indicative of whether a reflected version of the second signal has been received at the transmit end of the second communication channel.

In some embodiments, the method further comprises adjusting delay in one of the first and second channels based on the sampling of the signal indicative of whether the reflected version of the second signal has been received at the transmit end of the second communication channel.

In some embodiments, the method further comprises triggering the sampling with the signal indicative of receipt of the reflected version of the first signal at the transmit end of the first communication channel.

In some embodiments, the delay is adjusted to adjust signal propagation time skew between the first and second communication channels.

According to another aspect, the inventive concept is directed to a method for adjusting delay among a plurality of communication channels, the method comprising: (a) transmitting a first signal from a transmit end of the first communication channel to a receive end of the first communication channel; (b) transmitting a second signal from a transmit end of a second communication channel to a receive end of the second communication channel; (c) receiving a signal indicative of receipt of a reflected version of the first signal at the transmit end of the first communication channel; (d) using the signal indicative of receipt of the reflected version of the first signal at the transmit end of the first communication channel, sampling a signal indicative of whether a reflected version of the second signal has been received at the transmit end of the second communication channel; (e) adjusting delay in the first communication channel; and (f) repeating steps (a) through (e) until the signal indicative of whether a reflected version of the second signal has been received at the transmit end of the second communication channel changes states.

In some embodiments, the first communication channel is a channel for carrying a DQS signal.

In some embodiments, the second communication channel is a channel for carrying a DQ signal.

In some embodiments, the first and second signals are step signals.

In some embodiments, the method further comprises: (g) transmitting a third signal from a transmit end of a first communication channel to a receive end of the first communication channel; (h) transmitting a fourth signal from a transmit end of a third communication channel to a receive end of the third communication channel; (i) receiving a signal indicative of receipt of a reflected version of the third signal at the transmit end of the first communication channel; (j) using the signal indicative of receipt of the reflected version of the third signal at the transmit end of the first communication channel, sampling a signal indicative of whether a reflected version of the fourth signal has been received at the transmit end of the third communication channel; (k) adjusting delay in the third communication channel; (l) repeating steps (g) through (k) until the signal indicative of whether a reflected version of the fourth signal has been received at the transmit end of the third communication channel changes states; and (m) repeating steps (g) through (l) for each of the plurality of communication channels, wherein, during steps (g) through (l), each of the plurality of communication channels is the third communication channel.

In some embodiments, the first communication channel is a channel for carrying a DQS signal.

In some embodiments, the third communication channel is a channel for carrying a DQ signal.

In some embodiments, the third and fourth signals are step signals.

BRIEF DESCRIPTION OF THE DRAWINGS

The foregoing and other features and advantages of the invention will be apparent from the more particular description of preferred aspects of the invention, as illustrated in the accompanying drawings in which like reference characters refer to the same parts throughout the different views. The drawings are not necessarily to scale, emphasis instead being placed upon illustrating the principles of the invention. In the drawings, the thickness of layers and regions are exaggerated for clarity.

FIG. 3 is a schematic block diagram of a system in which compensation is made for skew among the channels, according to the inventive concept.

FIG. 12 illustrates the basic de-skewing process of the inventive concept. FIGS. 13A and 13B illustrate the de-skewing process for the case in which the DQS channel has a lower propagation time than the DQ channels. FIGS. 14A and 14B illustrate the de-skewing process for the case in which the DQS channel has a higher propagation time than the DQ channels.

FIG. 15 contains a flow chart of a method for reducing or eliminating skew among a plurality of communication channels, according to an embodiment of the inventive concept.

DETAILED DESCRIPTION

Figure 1:
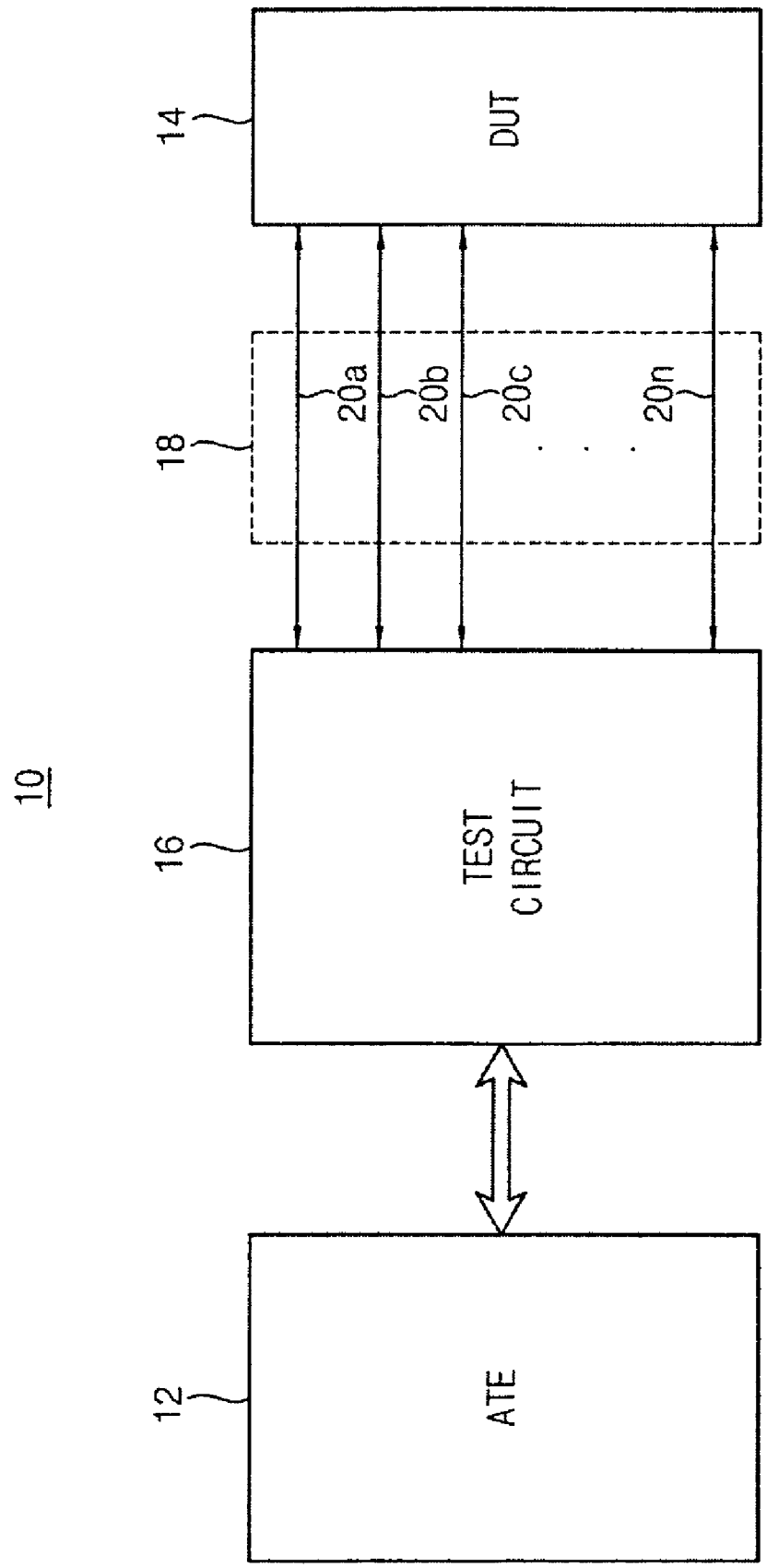
FIG. 1 is a schematic block diagram of a test system used to test a memory circuit.
Figure 2:
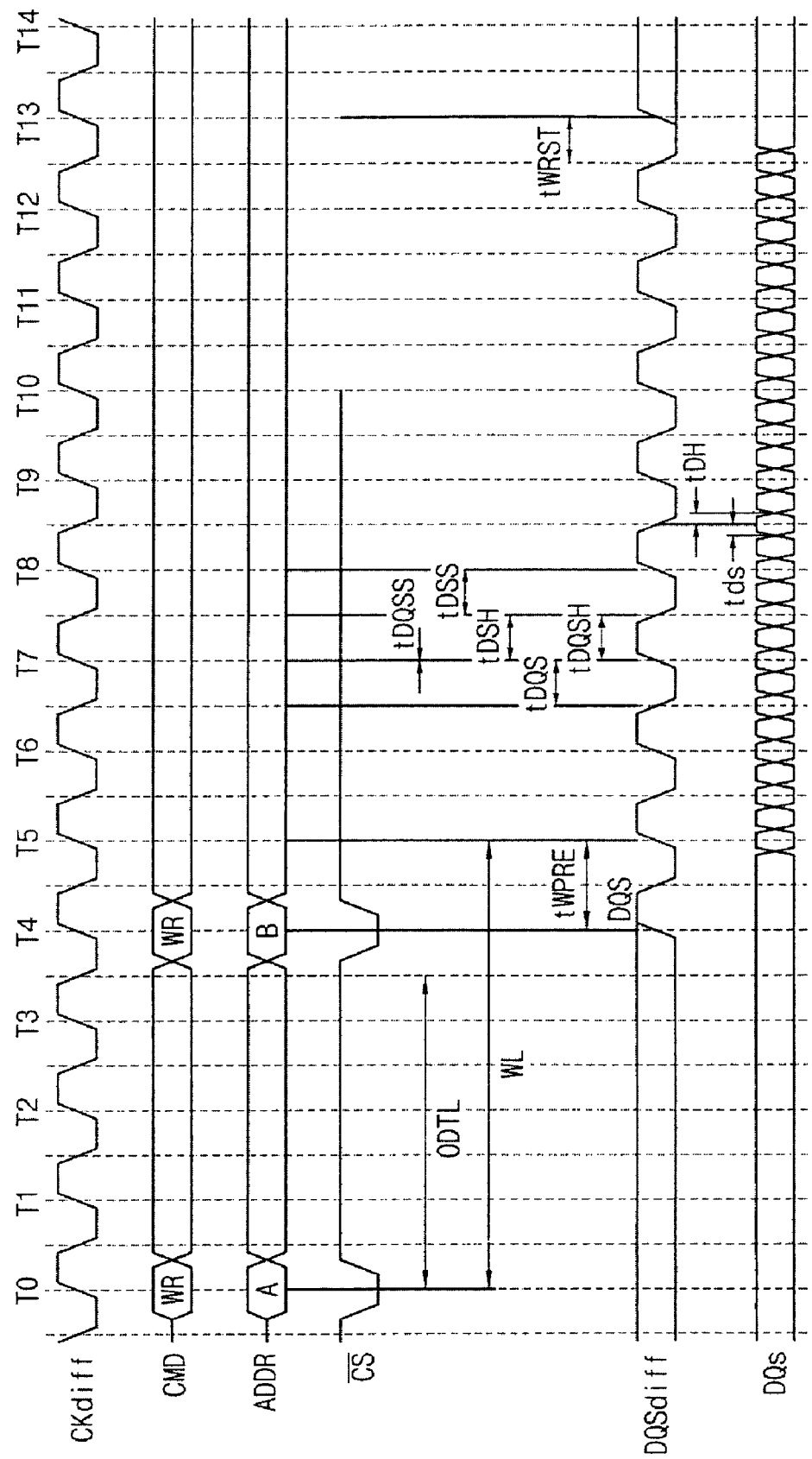
FIG. 2 is a timing diagram illustrating timing during a Write operation in a test system for testing a DDR3 DRAM memory circuit.

FIG. 2 is a timing diagram illustrating timing during a write operation in a test system for testing a DDR3 DRAM memory circuit. The timing diagram illustrates the clock signal CKdiff, the CMD and ADDR signals, a /CS signal, the data signals DQs and the data strobe signal DQSdiff. These are the standard signals used in DDR3 DRAM memory and are based on the standard DDR3 requirements. In the test system, as illustrated in FIG. 1, these signals are transferred along the channels 20a-20n of the interface 18 to simulate communication with the DDR3 memory circuit 14. As illustrated in the timing diagram of FIG. 2, when skew is present between channels in the test environment, for example, over 200 ps skew among the channels, then the test system testing the DDR3 DRAM will not meet the timing requirements of DDR3, and the testing will not function properly. Similarly, during a read operation, because of the skew among the channels, it is difficult to sense the DDR3 output with accuracy.

FIG. 3 is a schematic block diagram of a system 3000 in which compensation is made for this skew among the channels, according to the inventive concept. Referring to FIG. 3, the system 3000 includes a channel skew compensating circuit 3100, which communicates with a semiconductor memory device 3300, which may be under test. The channel skew compensating circuit 3100 transmits and receives signals SS1P, SS2P, . . . , SSnP, to and from the semiconductor memory device 1300 over channels CH1, CH2, . . . , CHn. The channel skew compensating circuit 3100 receives signals SS1, SS2, . . . , SSn from, for example, the automatic test equipment (not shown) in the case in which the semiconductor memory device is under test, or control circuitry in a memory controller (not shown) in the case in which the de-skewing capability of the invention is used in a memory controller.

Referring to FIG. 3, during a calibration mode, the channel skew compensating circuit 3100 measures relative propagation time of channels using, in one embodiment, a step signal. The circuit detects propagation time differences between the channels and sets delay time of at least one variable delay line coupled to each of the channels based on the propagation time differences. In an operational mode, with the appropriate delays set in the channels, skew among the channels is eliminated.

According to the inventive concept, the system operates in two modes, namely, a calibration mode and an operational mode. In the calibration mode, the relative skew among the channels is detected. This is accomplished by transmitting a signal, in one embodiment a step signal, through the channels. At the far end of the channels, i.e., the ends connected to the DUT, the signals are reflected and routed back through all of the channels. At the transmit end, the returning reflected signals are received. The relative differences in return times of the reflected signals in the channels are detected, such that the relative signal propagation times for the channels are detected. This difference in propagation delays for the channels is then used to determine an amount of delay which should be introduced into each channel, such that skew resulting from the differences in propagation times is compensated for and, therefore, reduced or eliminated. The determined delay for each of the channels is programmed into the asynchronous delay line circuits in the de-skewing circuitry.

In the operational mode, signals are transferred back and forth along the communication channels with the calibrated delays programmed in the programmable asynchronous delay line circuits in the de-skewing circuitry. Channel skew is eliminated such that the signals generated by the test circuit communicate with the DUT in accordance with the requirements of the DUT, for example, the DDR3 DRAM requirements.

According to the inventive concept, there are various approaches to reflecting the calibration signals back from the receive end of the channels, detecting the relative differences in propagation times of the channels and setting the delays in the channels to eliminate channel skew. According to one embodiment, the receive ends of the channels may be configured as short circuits. This can be accomplished in one particular embodiment by connecting the communication channels 330 to a "dummy" wafer with the appropriate channel connections formed thereon.

Figure 4A:
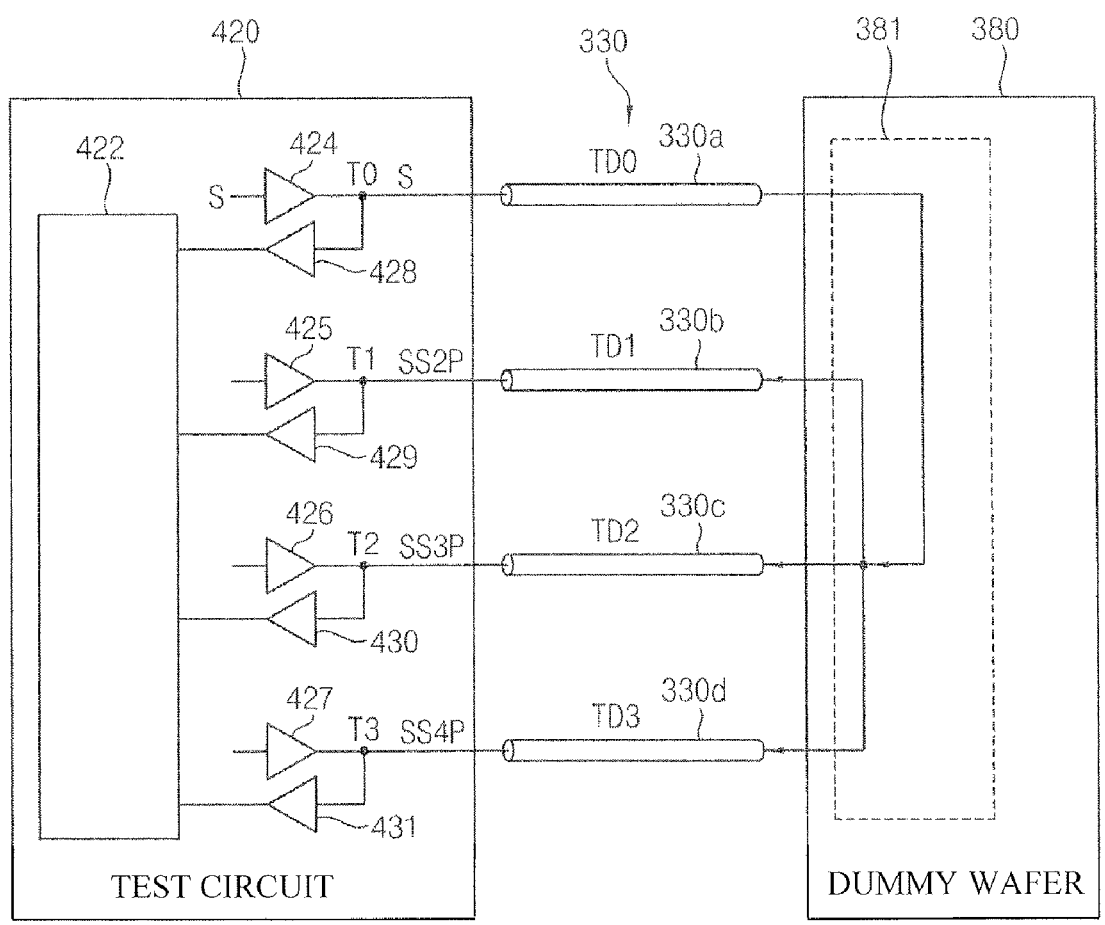
FIG. 4A is a schematic diagram of an embodiment of the inventive concept in which a dummy wafer is employed at the receive end of the channels to provide the reflected signals.
Figure 4B:
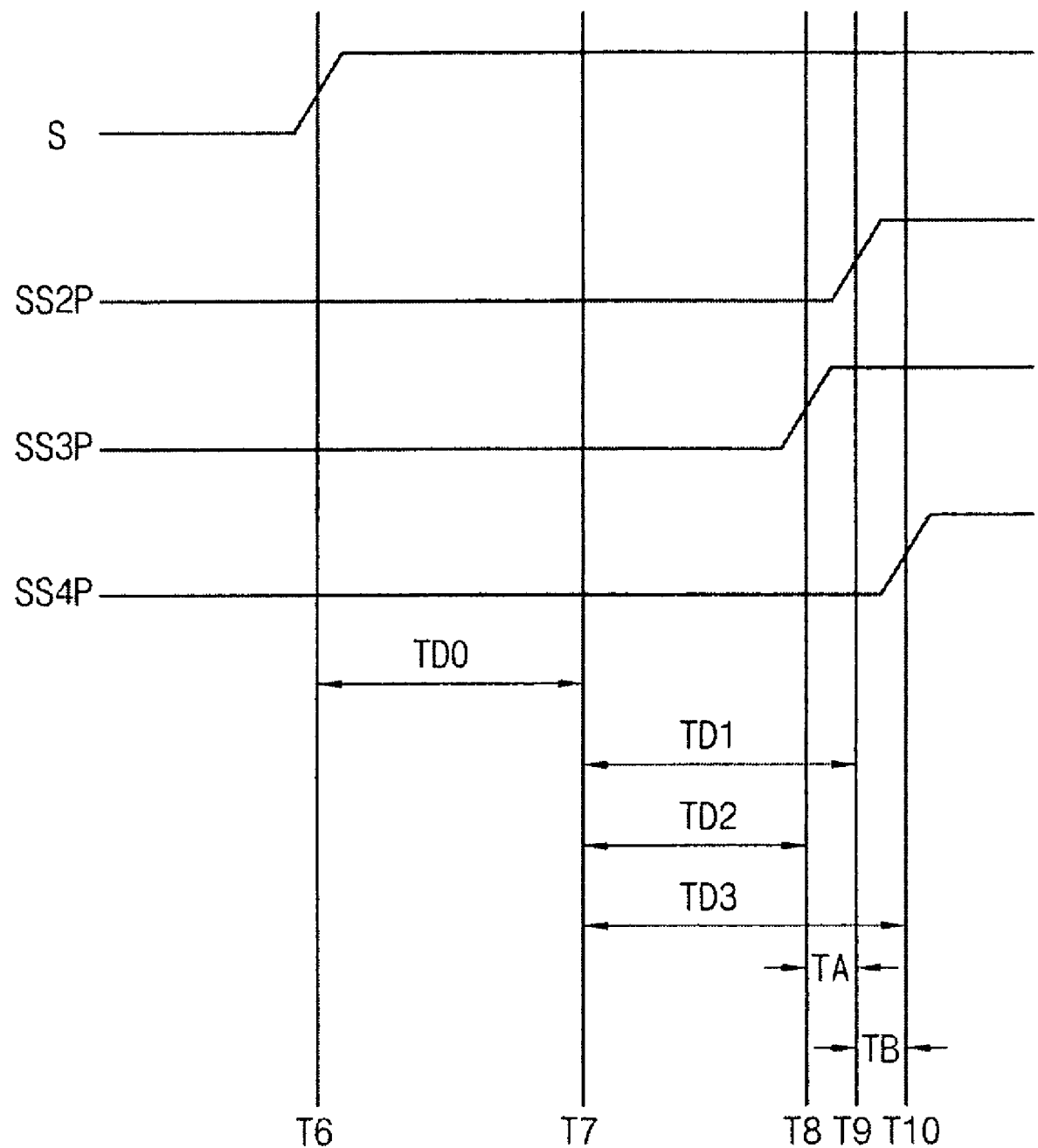
FIG. 4B is a timing diagram illustrating the timing of signals used in the approach of FIG. 4A.

FIG. 4A is a schematic diagram of an embodiment of the inventive concept in which a dummy wafer 380 is employed at the receive end of the channels to provide the reflected signals. FIG. 4B is a timing diagram illustrating the timing of signals used in the approach of FIG. 4A. Referring to FIG. 4A, a portion of the test circuit 420, including the transmit circuits 424, 425, 426, 427 for transmitting signals at the transmit ends of the communication channels 330a, 330b, 330c, 330d, respectively, is shown. It is noted that only four communication channels and associated circuitry are shown. It will be understood that the inventive concept is applicable to any number of communication channels. The dummy wafer 380 includes a pattern of conductors 381 which connect the communication channels as desired to provide the signals received at the receive ends of the communication channels as reflected signals back at the transmit end.

The channels 330a, 330b, 330c, 330d carry the transmit signals at signal nodes T0, T1, T2, T3, respectively, transmitted by the transmit circuits 424, 425, 426, 427, respectively, and are associated with transit or propagation times TD0, TD1, TD2, TD3, respectively. The transmit ends of the channels also include receive circuits 428, 429, 430, 431, which receive the reflected signals returning from the receive end of the channels 330a, 330b, 330c, 330d, respectively. The outputs of the receive circuits 428, 429, 430, 431 are provided to processing circuitry 422 which detects the incoming returning reflected signals and detects the relative time of receipt of the signals and, using this information, detects the relative signal propagation time of the channels. Using this detected relative propagation time, the processing circuitry 420 sets the delays for the asynchronous programmable delay line circuits, such that, during operation, skew among the channels caused by the differences in signal propagation times is eliminated.

FIG. 4B illustrates the timing of the signals in the calibration mode of the system of FIG. 4A. Referring to FIGS. 4A and 4B, a signal S, which in one embodiment is a step signal as shown in the timing diagram of FIG. 4B, is applied at the input end of the channel 330a as indicated by transmit signal S at node T0. As shown in FIG. 4B, the propagation time of signal SS2P back at the transmit end after reflection from the receive end is the sum of the propagation times TD0 (of channel 330a) and TD1 (of channel 330b). The propagation time TD2 of signal SS3P back at the transmit end after reflection from the receive end is the sum of the propagation times TD0 (of channel 330a) and TD1 (of channel 330b) and a variable A, which indicates the difference in propagation time between channel 330b and channel 330c. The propagation time TD3 of signal SS4P back at the transmit end after reflection from the receive end is the sum of the propagation times TD0 (of channel 330a) and TD1 (of channel 330b) and a variable B, which indicates the difference in propagation time between channel 330b and channel 330d. The variables A and B represent the differences in propagation times among the channels. That is, the difference between propagation time of TD1 and TD2 is A, and the difference between propagation time of TD1 and TD3 is B. These variables are used by the processing circuitry 420 to set the delays in the individual asynchronous delay line circuits to eliminate the skew among the channels.

Referring again to FIGS. 4A and 4B, the testing circuit 420 of the invention can be used to interface with a DDR3 DRAM memory circuit. Accordingly, the testing circuit 420 generates the DQ and DQS signals according to DDR3 DRAM specifications. According to these specifications, the DQS signal should be shifted with respect to the DQ signals by a 90-degree phase delay. In accordance with the inventive concept, the asynchronous programmable delay line used in providing the skew reduction delay in the channel carrying the DQS signal is set to provide the de-skewing delay and the 90-degree phase shift of the DQS signal required by the DDR3 DRAM specifications.

Figure 5A:
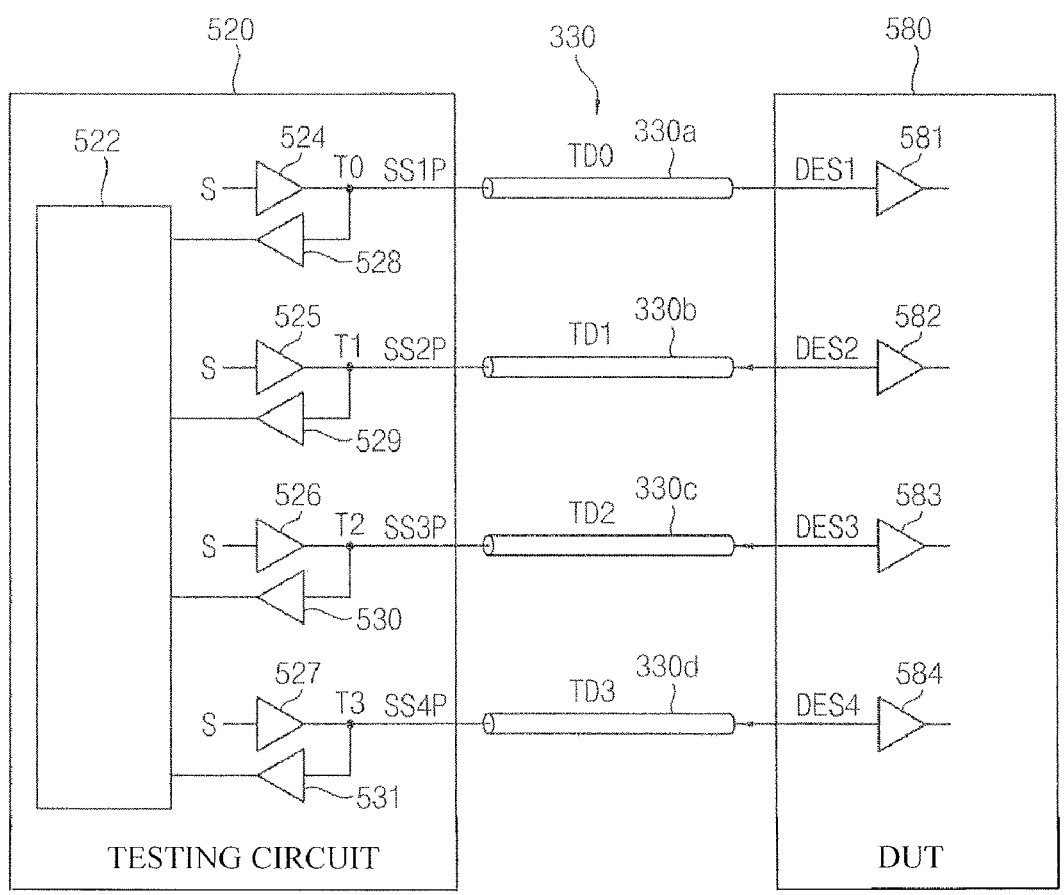
FIG. 5A is a schematic block diagram of an alternative embodiment of the system of FIG. 4A, according to the inventive concept.
Figure 5B:
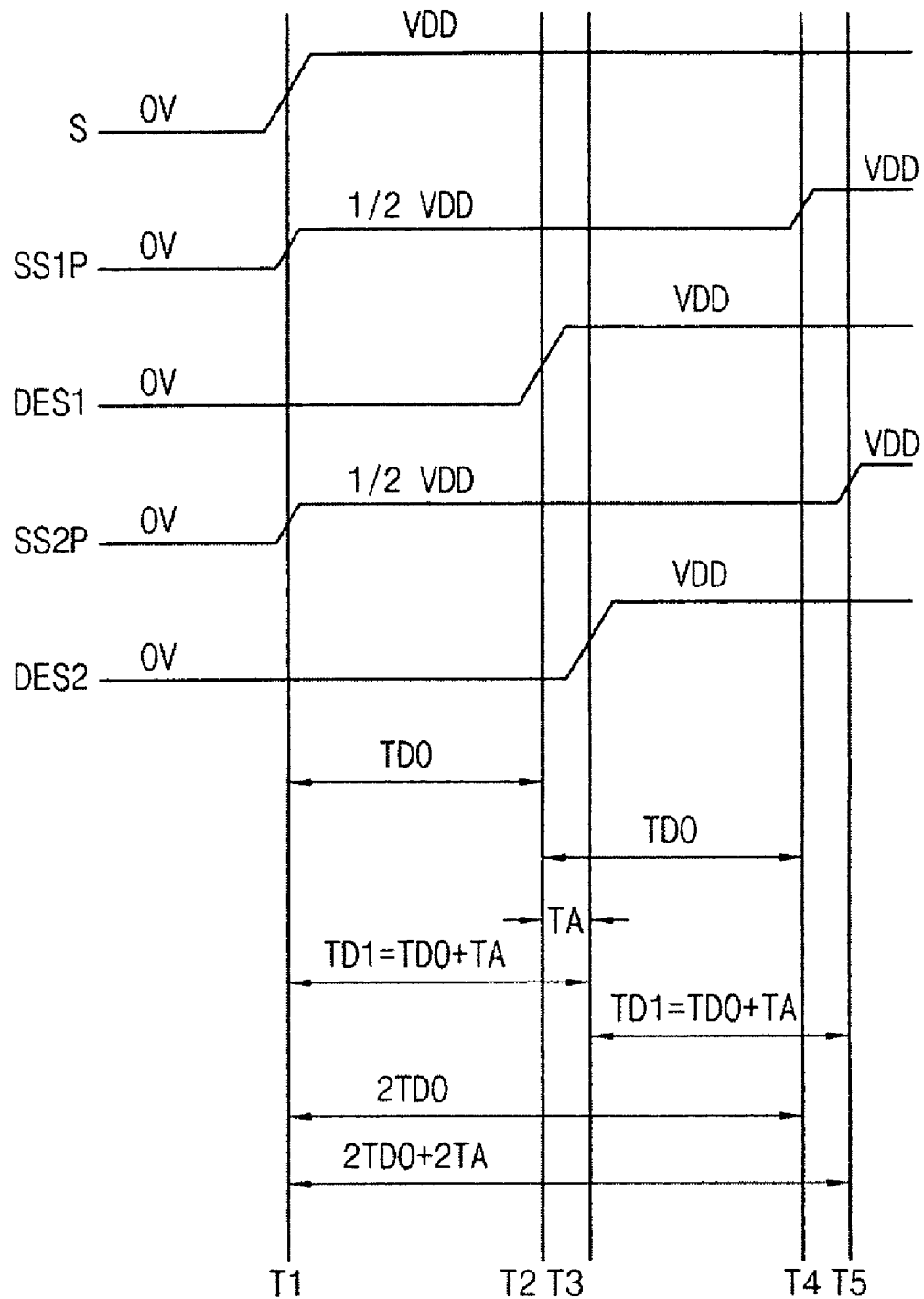
FIG. 5B is a timing diagram illustrating the timing of signals in the system of the configuration of FIG. 5A.

According to another aspect of the inventive concept, the calibration configuration of the system is different than the configuration described above in connection with FIGS. 4A and 4B. FIG. 5A is a schematic block diagram of an alternative configuration of the system, according to the inventive concept. FIG. 5B is a timing diagram illustrating the timing of signals in the system of the configuration of FIG. 5A. Referring to FIGS. 5A and 5B, in this embodiment, the system includes source-terminated channels 330a, 330b, 330c, 330d. That is, in the testing circuit 520, the channels are terminated at the transmit ends of the channels.

According to the embodiment of FIG. 5A, during calibration, the step signal S is transmitted as signals SS1P, SS2P, SS3P and SS4P at nodes T0, T1, T2, T3 at each of the transmit ends of the channels 330a, 330b, 330c, 330d, respectively. Because of the open termination at the receive ends, each step signal S is reflected back along its own respective channel 330a, 330b, 330c, 330d. The channels 330a, 330b, 330c, 330d carry the transmit signals SS1P, SS2P, SS3P and SS4P, respectively, transmitted by the transmit circuits 524, 525, 526, 527, respectively, and are associated with propagation times TD0, TD1, TD2, TD3, respectively. The transmit ends of the channels also include receive circuits 528, 529, 530, 531, which receive the reflected signals returning from the receive end of the channels 330a, 330b, 330c, 330d, respectively. The outputs of the receive circuits 528, 529, 530, 531 are provided to processing circuitry 522 which detects the incoming returning reflected signals and detects the relative time of receipt of the signals and, using this information, detects the relative signal propagation time of the channels. Using this detected relative propagation time, the processing circuitry 520 sets the delays for the asynchronous programmable delay line circuits, such that, during operation, skew among the channels caused by the differences in signal propagation times is eliminated.

FIG. 5B illustrates the timing of signals in the calibration mode of the system of FIG. 5A. Referring to FIGS. 5A and 5B, the signal S, which in one embodiment is a step signal as shown in the timing diagram of FIG. 5B, is applied at the input ends of the channels 330a, 330b, 330c, 330d, as indicated by transmit signals SS1P, SS2P, SS3P and SS4P. As shown in FIG. 5B, the propagation time of signal S to the receive end is TD0. Thus, the total propagation time from the transmit end to the receive end and back to the transmit end is 2TD0. Likewise, the propagation time of SS1P to the receive end is TD1=TD0+TA, such that the total propagation time from the transmit end to the receive end and back to the transmit end is 2TD1=2(TD0+A), where A indicates the propagation time difference between channel 330a and 330b. This approach to finding the relative propagation times among the channels can also be applied to the remaining channels. For example, the total propagation time of SS2P from the transmit end to the receive end and back to the transmit end is 2TD2=2(TD0+B), where B indicates the propagation time difference between channel 330a and 330c. The total propagation time of SS3P from the transmit end to the receive end and back to the transmit end is 2TD3=2(TD0+C), where C indicates the propagation time difference between channel 330a and 330d. The variables A, B and C are used by the processing circuitry 520 to set the delays in the individual asynchronous delay line circuits to eliminate the skew among the channels. It is noted that the magnitude of the step signal S is VDD, and the magnitude of the signals SS1P, SS2P, SS3P and SS4P is VDD/2, due to the termination at the transmit end. The magnitude of the signals DES1, DES2, DES3 and DES4 at the receive end is VDD.

This approach of the invention provides several advantages. For example, as noted above, the variables A, B, C provide measurements of propagation time differences among the channels, for a single pass through the channel. However, this approach of the invention actually detects twice the time differences A, B, C because the propagation time differences are for two transits by the signal S through the channels. Since twice the propagation time difference between channels is detected, the measurement provides double the resolution for the difference detection. This results in a more accurate detection of propagation time difference, more accurate setting of the delays in the channels, and, therefore, more effective skew reduction/elimination. Also, by detecting the magnitude of the signal returning to the transmit end, the loading at the receive end is detected simultaneously with propagation time differences.

Figure 6A:
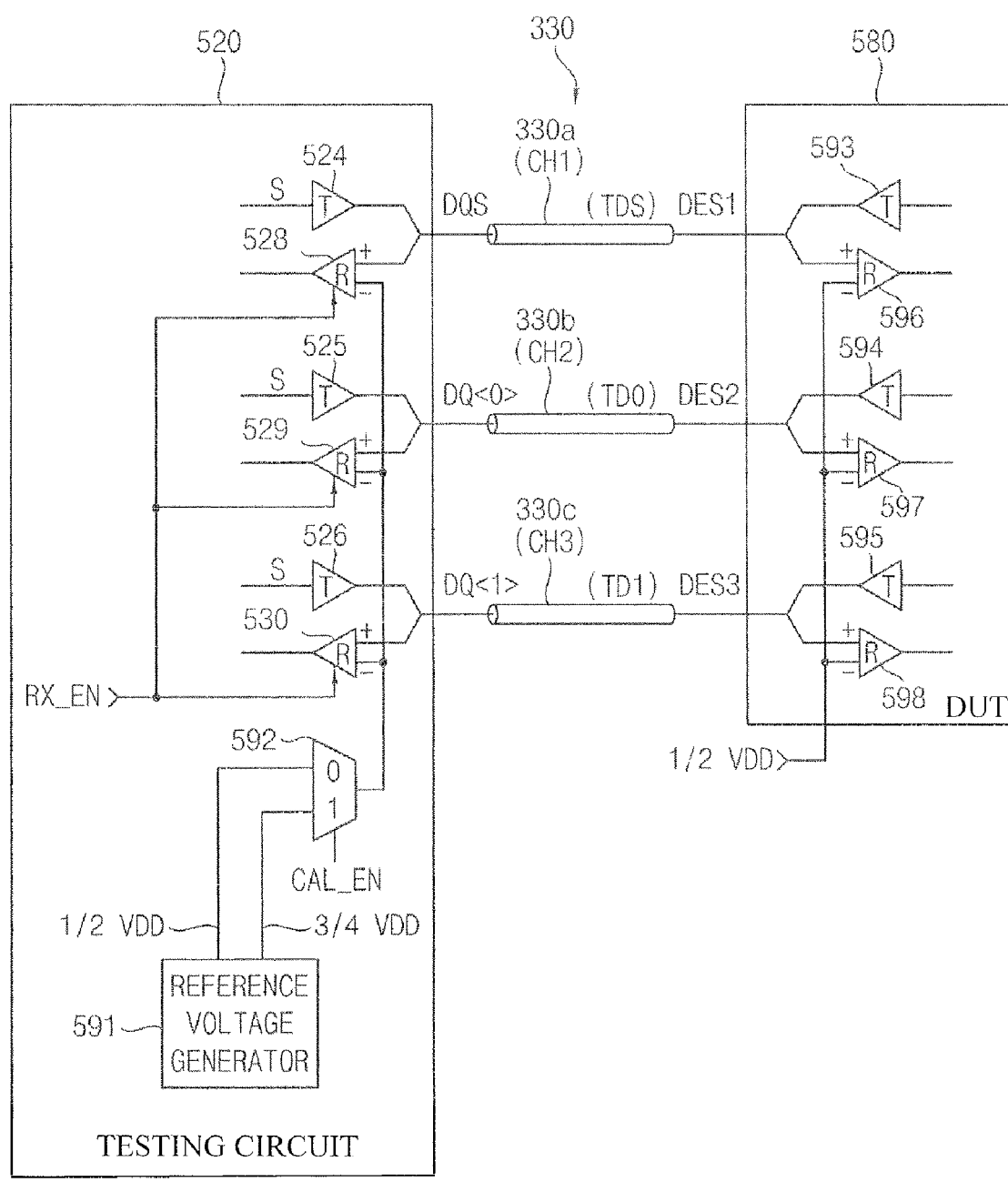
FIG. 6A contains a detailed schematic block diagram of the system of FIGS. 5A and 5B illustrating details of the transmit/receive circuitry in the testing circuit and the transmit/receive circuitry in the DUT, according to an embodiment of the inventive concept.
Figure 6B:
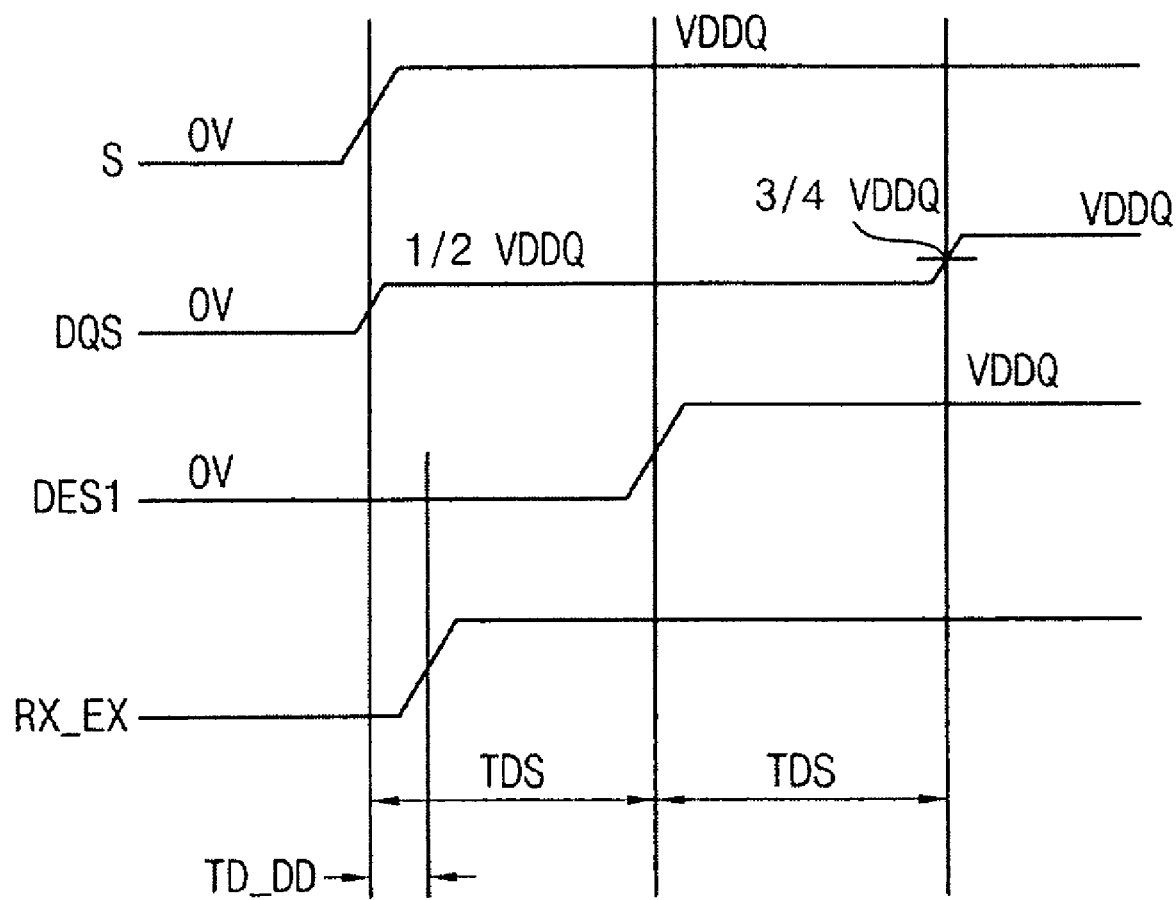
FIG. 6B contains a timing diagram of signals illustrating operation of the circuit of FIG. 6A.

FIG. 6A contains a detailed schematic block diagram of the system of FIGS. 5A and 5B, illustrating details of the transmit/receive circuitry in the testing circuit 520 and the transmit/receive circuitry in the memory circuit 580, according to an embodiment of the inventive concept. FIG. 6B is a timing diagram of signals illustrating operation of the circuit of FIG. 6A. In this exemplary illustration, applied to a DDR3 DRAM configuration, channel 330a (CH1) carries the DQS data strobe signal, channel 330b (CH2) carries the data signal DQ<0>, and channel 330c (CH3) carries the data signal DQ<1>. Referring to FIG. 6A, the system is shown with three channels 330a (CH1), 330b (CH2), 330c (CH3) for ease of illustration. It is understood that more channels could actually be included in the system, according to the inventive concept.

Referring to FIGS. 6A and 6B, the transmit/receive circuitry in the testing circuit 520 includes transmitter circuits 524, 525, 526 and receive circuits 528, 529, 530, connected to channels 330a (CH1), 330b (CH2), 330c (CH3), respectively. The receive circuits are configured as comparators. The skew reduction calibration according to the inventive concept is partially controlled by a calibration multiplexer 592. A reference voltage generator generates two different reference voltages to be applied to the inverting inputs of the receive comparator circuits 528, 529, 530, under the control of a calibration enable signal CAL_EN applied to the select control input of the multiplexer 592. The reference voltage generator generates a first reference voltage at a level of one-half the VDD voltage level and a second reference voltage at a level of three-fourths the VDD voltage level. During skew reduction calibration, the CAL_EN signal is active high, and the ¾ VDD reference voltage is applied to the inverting inputs of comparator circuits 528, 529, 530. During normal operation, the CAL_EN signal is inactive low, and the ½ VDD reference voltage is applied to the comparator circuits 528, 529, 530.

As described above, in this embodiment of the inventive concept, the receive ends of the channels 330a, 330b, 330c are terminated as open circuits. This can be accomplished by disconnecting the DUT 580 during calibration. In an alternative configuration, as illustrated in FIG. 6A, the memory circuit 580 is fabricated with controllable on-die termination (ODT) circuits, which include transmit circuits 593, 594, 595 and receive circuits 596, 597, 598. During calibration, the ODT circuits are set such that the terminations at the receive ends of the channels are in the open configuration, such that signals arriving at the receive ends of the channels, i.e., DES1, DES2, DES3, are reflected back to the transmit ends of the channels. The ½ VDD level voltage is also applied to the inverting inputs of the receive comparators 596, 597, 598 by the ATE. The ½ VDD level voltage applied to the calibration multiplexer 592 can be generated by the same source which generates the ½ VDD level voltage applied to the receive circuits 596, 597, 598. Alternatively, the ½ VDD level voltages may be generated by different sources.

It should be noted that although the testing circuitry 520 is described herein as being part of or interfaced with ATE, the testing circuitry 520 can be part of a memory controller used in controlling a memory, such as memory 580, during normal memory operation absent any testing devices or environment. Also, the DUT 580 may be a memory device, such as a DRAM device, operating in a normal operational environment, absent any testing devices or environment.

Referring to FIGS. 6A and 6B, when calibration is to be performed, the signal S, which in one embodiment is a step signal as illustrated in the timing diagram of FIG. 6B, is applied to the transmit circuits 524, 525, 526. The signal is applied at a level of VDD. The propagation time for channel 330a (CH1) is indicated as TDS; the propagation time of channel 330b (CH2) is indicated as TD0; and the propagation time of channel 330c (CH2) is indicated as TD1. Referring to the timing diagram of FIG. 6B, when calibration begins, the CAL_EN signal becomes active high. After a short delay, the receive enable signal RX_EN becomes active high to enable the receive comparators 528, 529, 530 to receive and process the returning signals reflected from the receive ends of the channels. Using the DQS signal on channel 330a (CH1) as an example, when the reflected signal returns, its level is ¾ VDD, such that the receive comparator 528 trips and switches to active high, which is detected by the processing circuitry in the testing circuit 520. The same process occurs in the rest of the channels such that the processing circuitry detects the relative propagation times in the channels.

Figure 6C:
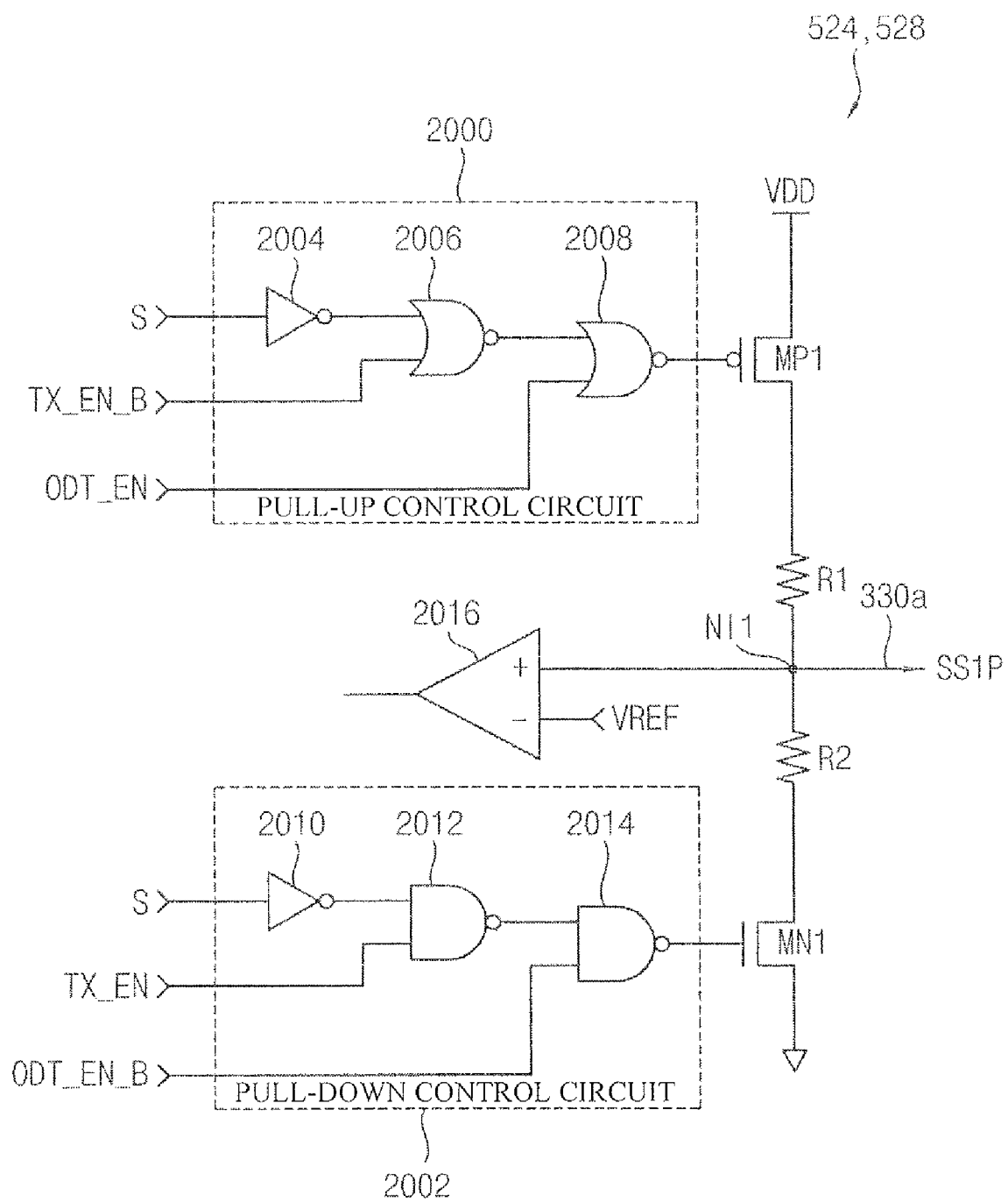
FIG. 6C contains a schematic block diagram of a portion of the transmit circuitry and the receive circuitry illustrated in FIG. 6A.

FIG. 6C contains a schematic block diagram of a portion of the transmit circuitry (524, 525, 526, 527) and the receive circuitry (528, 529, 530, 531) illustrated in FIG. 5A. It is noted that the circuitry 524, 528 for channel 330a generating signal SS1P is illustrated in FIG. 6C by way of example. FIG. 6C illustrates the circuitry used to control transmission of signals SS1P on the channel 330a, including the calibration signal S and the control signal used to control the on-die termination capability of the memory circuit DUT 580 at the receive end of the channel. FIG. 6C also illustrates the source termination feature of the invention.

Referring to FIG. 6C, the circuitry includes a pull-up control circuit 2000 and a pull-down control circuit 2002. The output of the pull-up control circuit 2000 is applied to the gate of a P MOSFET MP1, and the output of the pull-down control circuit 2002 is applied to the gate of a N MOSFET MN1. The P MOSFET MP1 is connected between the voltage VDD and one end of a resistance R1. The other end of the resistance R1 is connected to a node NI1, which is connected to the channel 330a. When the output of the pull-up control circuit 2000 is low, the P MOSFET MP1 is turned on such that the node NI1 connected to the channel 330a is pulled up through resistance R1. The N MOSFET MN1 is connected between the ground voltage and one end of a resistance R2. The other end of the resistance R2 is connected to the node NI1. When the output of the pull-down control circuit 2002 is high, the N MOSFET MN1 is turned on such that the node NI1 connected to the channel 330a is pulled down through resistance R2.

The pull-up control circuit 2000 receives the S signal, a transmit enable bar signal TX_EN_B and an on-die termination enable control signal ODT_EN. The S signal is applied to the input of an inversion circuit 2004, and the inverted output of the inversion circuit 2004 is applied to an input of a NOR gate 2006. The TX_EN_B signal is applied to the other input of the NOR gate 2006. The output of the NOR gate 2006 is applied to a first input of another NOR gate 2008. The ODT_EN signal is applied to the second input of the NOR gate 2008. The TX_EN_B signal permits either the S signal or the ODT_EN signal to be transmitted to the node NI1 and on the channel 330a depending on its state. When the ODT circuitry at the receive end of the channel is to be controlled, the ODT_EN signal is activated appropriately. When a signal, for example, the step calibration signal according to embodiments of the invention, is to be transmitted on the channel 330a, the S signal is activated appropriately.

The pull-down control circuit 2002 receives the S signal, a transmit enable signal TX_EN and an on-die termination enable bar control signal ODT_EN_B. The S signal is applied to the input of an inversion circuit 2010, and the inverted output of the inversion circuit 2010 is applied to an input of a NAND gate 2012. The TX_EN signal is applied to the other input of the NAND gate 2012. The output of the NAND gate 2010 is applied to a first input of another NAND gate 2014. The ODT_EN_B signal is applied to the second input of the NAND gate 2014. The TX_EN signal permits either the S signal or the ODT_EN_B signal to be transmitted to the node NI1 and on the channel 330a depending on its state. When the ODT circuitry at the receive end of the channel is to be controlled, the ODT_EN_B signal is activated appropriately. When a signal, for example, the step calibration signal according to embodiments of the invention, is to be transmitted on the channel 330a, the S signal is activated appropriately.

Referring to FIG. 6C, when the ODT_EN signal is high, normal receiving operation is activated. When the ODT_EN signal is low, the de-skew calibration procedure is activated. When the TX_EN signal is active high, normal transmitting operations and the de-skew calibration process can be activated. The reference voltage VREF is set to a value of ½ VDDQ during normal operation and is set to a value of ¾ VDDQ during the de-skew calibration procedure.

The receive circuitry of FIG. 6C includes a comparator 2016. The noninverting input of the comparator 2016 is connected to the node NI1, and the inverting input of the comparator 2016 is connected to a reference voltage VREF. The comparator compares signals on the channel 330a and node NI1 with the reference voltage VREF to identify signals on the channel 330a.

Figure 7A:
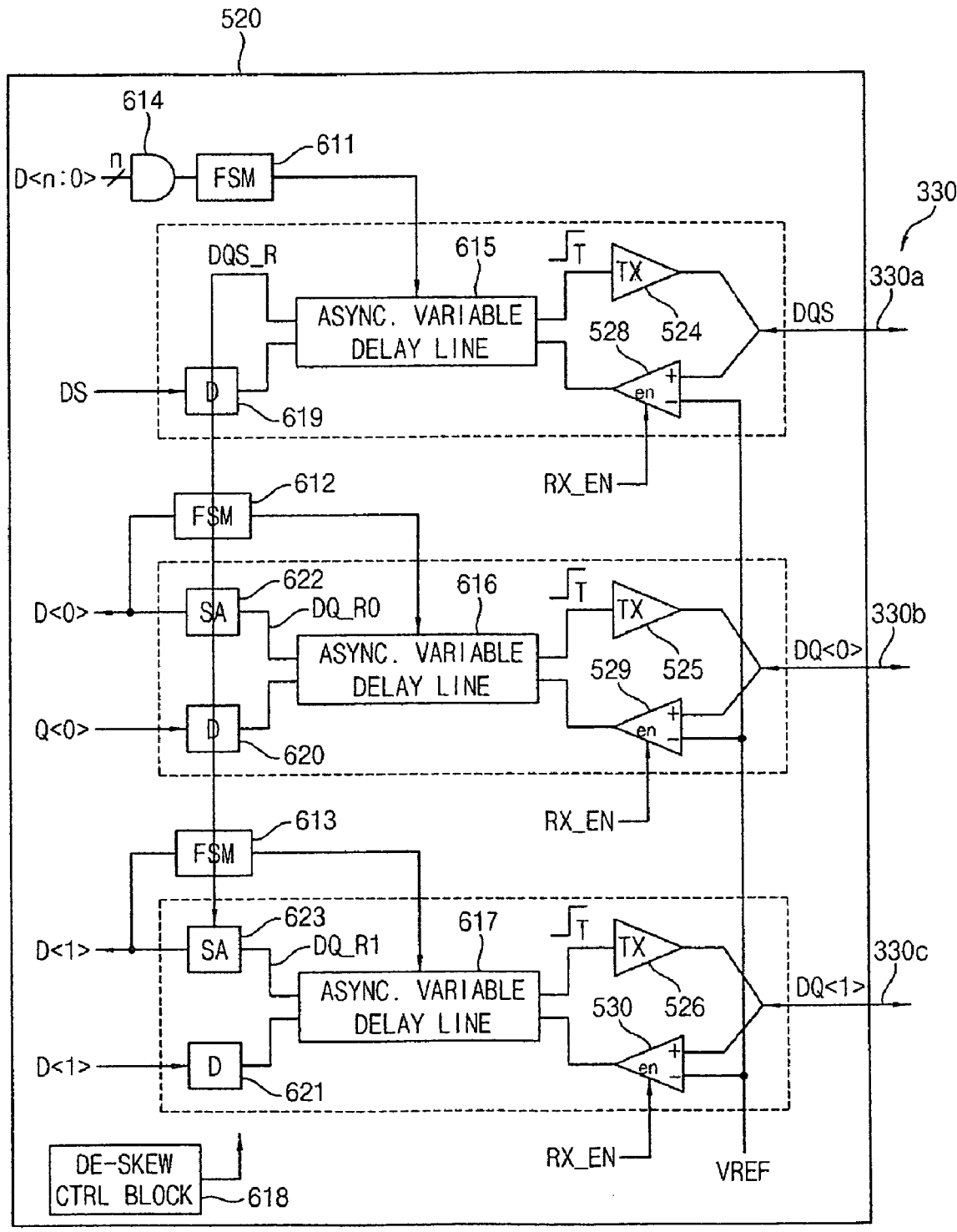
FIG. 7A is a detailed schematic block diagram of a portion of the circuitry in the testing circuit used to control the de-skewing delay, according to an embodiment of the inventive concept.
Figure 7B:
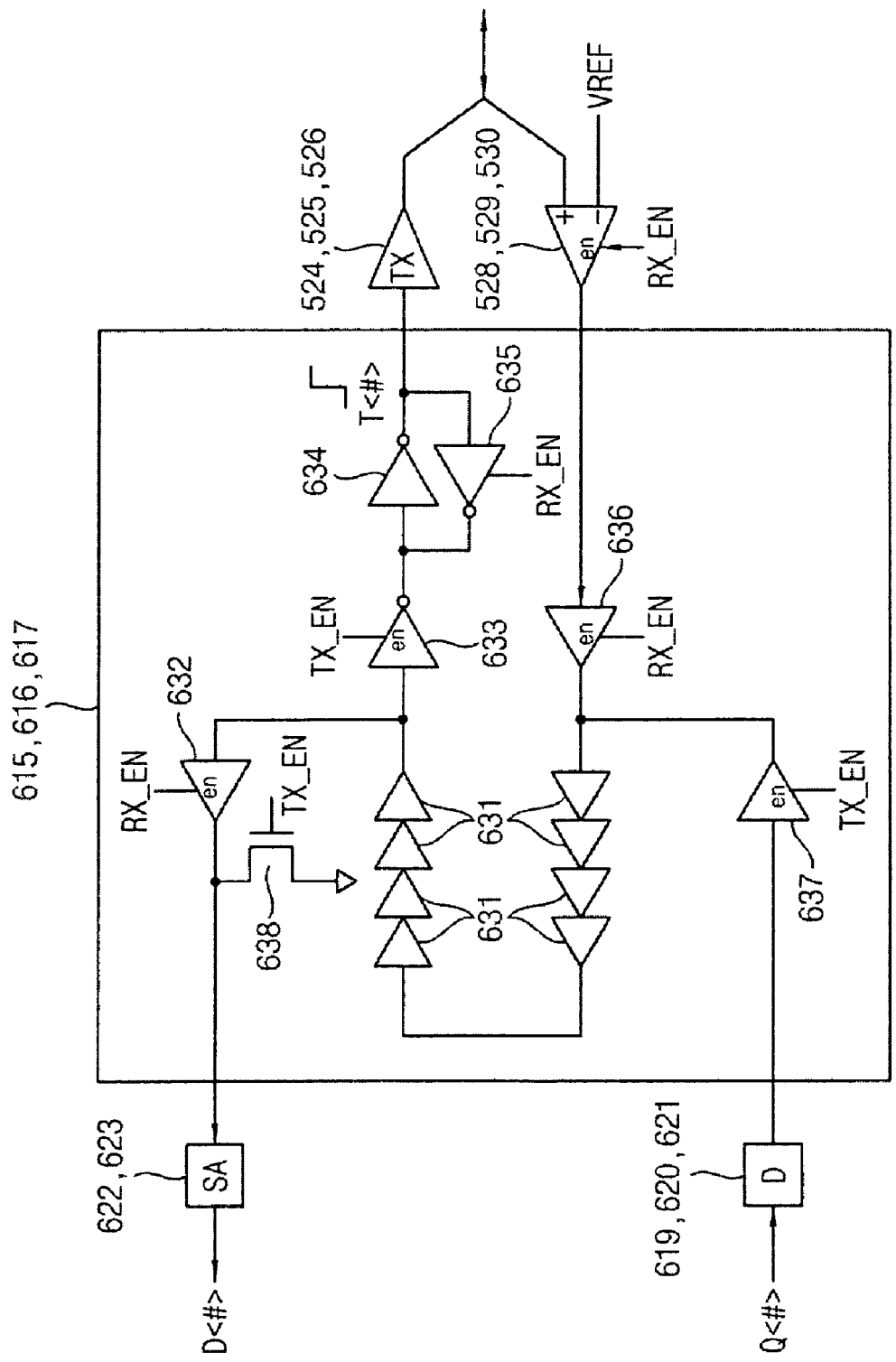
FIG. 7B is a detailed schematic block diagram of a portion of the circuitry shown in FIG. 7A, in the dashed lines of FIG. 7A, according to an embodiment of the inventive concept.

FIG. 7A is a detailed schematic block diagram of a portion of the circuitry in the testing circuit 520 used to control the de-skewing delay, according to an embodiment of the inventive concept. Specifically, FIG. 7A contains a schematic block diagram of the delay circuitry and the transmit/receive circuitry in the testing circuit 520. FIG. 7B is a detailed schematic block diagram of a portion of the circuitry shown in FIG. 7A, in the dashed lines of FIG. 7A, according to an embodiment of the inventive concept.

Referring to FIG. 7A, as described above, the circuitry includes transmit circuits 524, 525, 526 for transmitting signals to the channels 330 and receive circuits, in the form of comparators 528, 529, 530. A reference voltage signal VREF is applied to the inverting inputs of the comparators 524, 525, 526. When an incoming signal exceeds the reference voltage VREF, the comparators signal the crossover by changing states from inactive low to active high. The output signals from the comparators 528, 529, 530 are received by respective asynchronous variable delay line circuits 615, 616, 617, under the control of a receive enable control signal RX_EN applied to the comparators. The receive enable control signal RX_EN, as well as all of the control signals used in the de-skewing circuitry of the testing circuit 520, is generated by a de-skew control block 618. De-skew control block 618 controls the de-skewing function according to the inventive concept.

The signals used to test the DUT are generated in the ATE and/or the testing circuit 520 and are applied to the circuitry of FIG. 7A for transmission to the DUT. In the case of a DDR3 DRAM memory circuit, these signals include, but are not limited to, the data signals DQ<#>, a data strobe control signal DS, the CMD signal, the ADDR signal and the REFCLK signal. For simplicity of illustration, the block diagram of FIG. 7A shows only the signals D<0>, Q<0>, D<1>, Q<1>, D<n:0> and DS. The channel illustrated at the top of FIG. 7A used to communicate via the communication channel 330a is used for the data strobe signal DQS. The second and third channels used to communicate via the communication channels 330b and 330c, respectively, illustrated in FIG. 7A are used for the DQ<0> and DQ<1> signals, respectively.

In the top DQS channel, the signals D<n:0> are received at an n-input AND gate 614, which provides its output to an input of a finite state machine (FSM) 611. The FSM 611 provides the control data generated according to the inventive concept to set the delay in the delay line circuitry 615 to eliminate skew among the channels. In the second and third illustrated channels, the D<0> and D<1> data signals are applied to respective FSMs 612, 613, and the FSMs 612, 613 apply the control data generated according to the inventive concept to set the respective delay line circuitry 616, 617 to eliminate skew among the channels.

Each of the DQ channels includes a sense amplifier 622, 623, which senses signals from the delay lines 616, 617, respectively, and forwards the signals to the processing circuitry in the testing circuit 520. The DQS channel and the DQ channels each include a D flip-flop 619, 620, 621, which receives signals DS, Q<0>, Q<1>, respectively, and forwards the signals to the delay line circuitry 615, 616, 617, respectively, to be transmitted across respective channels 330a, 330b, 330c. It is noted that the DS/DQS channel does not include a sense amplifier. This is because the signals received in the DQS channel are sensed by the sense amplifiers 622, 623 in the DQ channels. According to the inventive concept, when the reflected calibration signal returns from the receive end of the channel 330a, it is routed to the sense amplifiers 622, 623 for detection, such that the propagation time difference between the DQS channel and the DQ channels is detected. That is, according to an embodiment of the inventive concept, the de-skewing of the channels is performed using the DQS channel signal as a baseline signal, and delays for the other channels are computed and implemented based on comparisons with the DQS channel signal.

Referring to FIGS. 7A and 7B, the asynchronous variable delay line circuitry 615, 616, 617 in each channel includes a plurality of buffer delay elements 631 connected in series. Each of the delay elements 631 has a predetermined time delay, such that the delay line circuit 615, 616, 617 is programmable to provide a desired time delay in signals from the input of the chain of delay elements 631 to the output of the chain of delay elements 631.

In the configuration of the delay line circuit 615, 616, 617, the same chain of elements 631 is used to provide the desired delay for both incoming and outgoing signals. That is, when a signal is being output to the communication channel, for example, a DQ signal, i.e., Q signal, the Q signal is applied at the input of the D flip-flop 619, 620, 621. The output of the D flip-flop 619, 620, 621 is applied to the input of a controllable tri-state pass buffer 637, which is enabled by the TX_EN signal, which is active high during a transmit operation. The Q signal is output by the pass buffer 637 to the input end of the chain of delay elements. The signal is delayed according to the delay programmed into the chain of delay elements 631, and the delayed signal is applied to the input of an inverting tri-state pass buffer 633, which is controlled by the TX_EN control signal. Since TX_EN is active high during the transmit operation, the signal passes through the tri-state pass buffer 633 to a transmit buffer 634, to the transmit circuit 524, 525, 526, and then to the channel 330a, 330b, 330c. It is noted that when TX_EN is active high, the FET 638 is active, such that the output of a receive tri-state buffer 632 is disabled. As a result, the signal being transmitted cannot be applied to the sense amplifier 622, 623.

In contrast, when a signal is being input from a communication channel, for example, a DQ signal, i.e., D signal, the receive enable control signal RX_EN is active high, and the TX_EN signal is inactive low. A signal arriving at the receive circuit 528, 529, 530 is compared to the reference signal VREF. When the incoming signal exceeds the VREF signal, the output of the receive circuit 528, 529, 530 is active high. This signal is passed to a tri-state pass buffer 636, which is controlled by the RX_EN signal, which, because of its active high state, passes the incoming signal to the input end of the chain of delay elements 631, which delays the signal and applies the delayed signal to the input of the tri-state pass buffer 632 controlled by the RX_EN signal. The enabled tri-state pass buffer 632 passes the signal to the sense amplifier 622, 623, which outputs the signal to the processing circuitry of the testing circuit 520 as an input D signal.

Referring still to FIGS. 7A and 7B, during de-skew calibration, the signal S, which in one embodiment is a step signal, is applied as signal T at the transmit circuits 524, 525, 526. After a short delay, the receive enable control signal RX_EN transitions from inactive low to active high such that the returning reflected signals can be received. The reflected signals are applied to the noninverting inputs of the receive comparators 528, 529, 530, such that, when they exceed the reference voltage VREF applied at the inverting inputs of the receive comparators 528, 529, 530, which as noted above is ¾ VDDQ during calibration, the receive comparator outputs transition to active high. These comparator output signals are passed to their respective asynchronous delay line circuits 615, 616, 617, which delay the signals as described above and output the delayed signals, which, in this exemplary illustration are referred to as DQS_R, DQ_R0, DQ_R1. These delayed signals are applied to the inputs of the sense amplifiers 622, 623 which detect the relative times of their arrival. As noted above, the DQS_R signal is applied to the sense amplifiers 622, 623, such that the sense amplifiers detect the propagation time differences between the DQS channel and the individual DQ channels, according to the inventive concept.

Figure 7C:
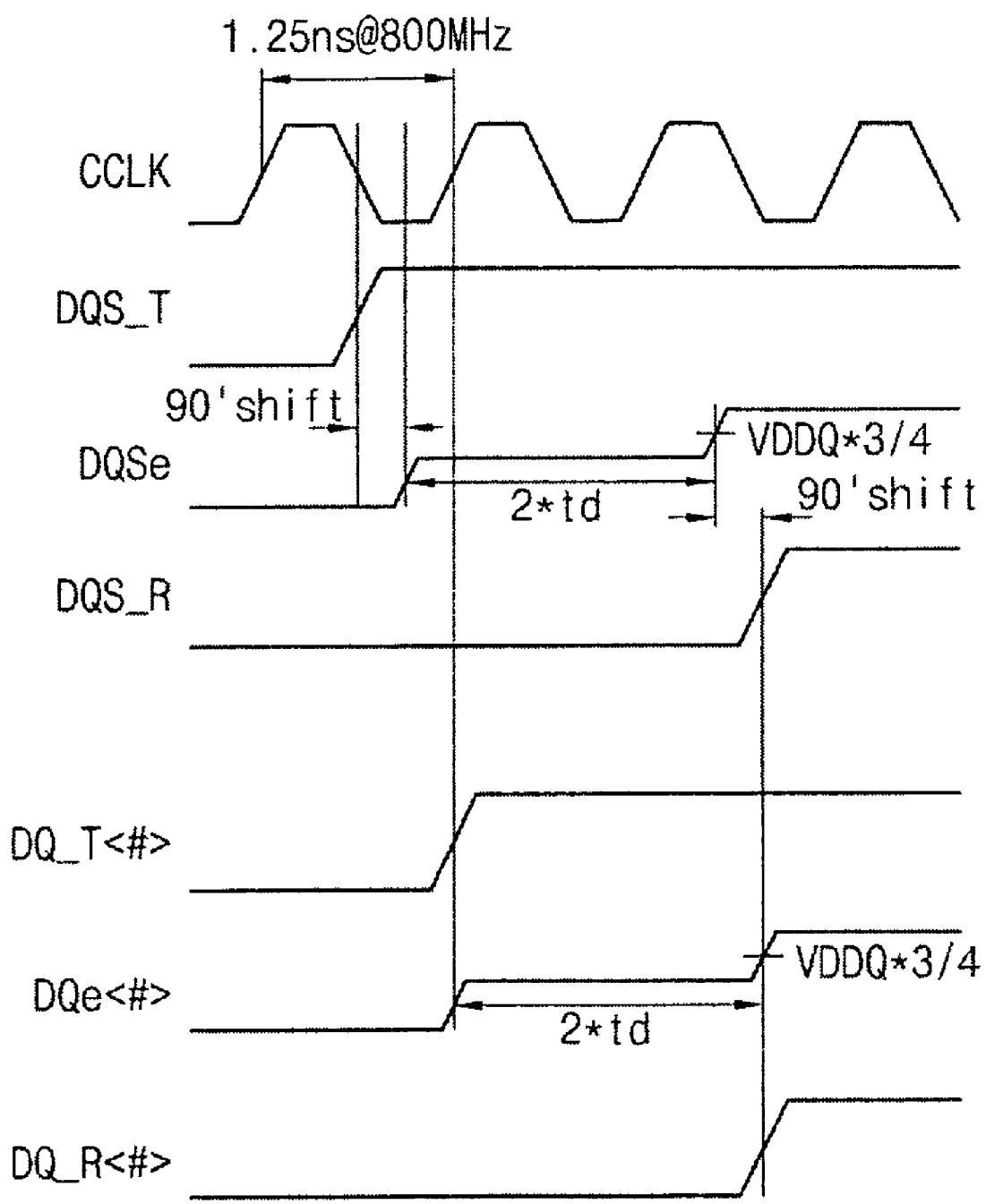
FIG. 7C is a timing diagram illustrating a process of detecting channel propagation time differences to eliminate skew among channels, according to an embodiment of the inventive concept.

FIG. 7C is a timing diagram illustrating the process of detecting channel propagation time differences to eliminate skew among the channels according to an embodiment of the inventive concept. Referring to FIGS. 7A through 7C, according to the exemplary embodiment shown in FIG. 7C, in a DDR3 DRAM, high-frequency operation, with which the signals generated by the test circuit 520 must be compatible, can be at 1.6 Gbps. According to this embodiment, in the de-skewing procedure, a calibration clock signal CCLK is used. The clock signal CCLK can be, for example, an 800 MHz clock signal. As illustrated in the timing diagram of FIG. 7C, the DQS_T signal, which in one embodiment is a step signal, is generated to be transmitted along the DQS channel. The returning reflected signal DQS_R is output by the asynchronous variable delay line 615, as shown in FIG. 7A. Likewise, the data signals DQ_T<#> signals are generated to be transmitted along the DQ channels. The returning reflected data signals DQ_R<#> are outputted by their respective asynchronous variable delay lines 616, 617, as shown in FIG. 7A. According to the inventive concept, as shown in the timing diagram of FIG. 8C, the signal DQS_T is generated to have 180 degrees advance phase shift with respect to the DQ_T<#> signals. As a result, as shown in the timing diagram, the received DQS_R and DQ_R<#> signals are in phase at the outputs of their respective delay lines 615, 616, 617. This is accomplished by setting the delay line 615 of the DQS channel to have 90 degrees of delay phase shift, such that a total of 180 degrees of delay phase shift is experienced by the DQS signal back and forth to and from the receive end of the channel. The 90-degree phase shift is shown in the timing diagram of FIG. 8C in the comparison of the DQS_T signal and the DQSe signal. On each path of the signal, 90 degrees of delay phase shift is introduced. The DQSe and DQe<e> signals also show the ¾ VDDQ amplitude of the reflected signals required for detection at the transmit end of the channels, as described above.

As described below in detail in connection with other embodiments of the inventive concept, the 90-degree delay phase shift introduced according to the inventive concept into the DQS channel provides the invention with important advantages. For example, although the invention has been described thus far in connection with a BOT testing circuit, the invention is also applicable to a memory controller circuit which can be used in a memory system to control a memory circuit, such as, for example, a DDR3 DRAM memory circuit. The memory controller circuit of the inventive concept utilizes the calibration approach described herein to detect relative signal propagation times among communication channels between the memory controller and the memory device. Likewise, the memory controller according to the inventive concept also uses the asynchronous delay lines described herein to correct for skew among the channels based on the detection of the propagation time differences. With the 90-degree delay phase shift introduced into the DQS channel according to the inventive concept, the memory controller operates according to the DDR3 specifications, which require this 90-degree phase-shift delay. In conventional memory controllers used in connection with DDR3 memories, such as DRAM, a special phase-locked loop (PLL) or delay-locked loop (DLL) is required to provide the 90-degree phase shift in the DQS signal. With the 90-degree phase delay built into the delay circuitry according to the inventive concept, the need for such a special PLL or DLL is eliminated. The memory controller according to the inventive concept can operate to transmit the DQS and DQ signals using a 0-degree clock.

Figure 8:
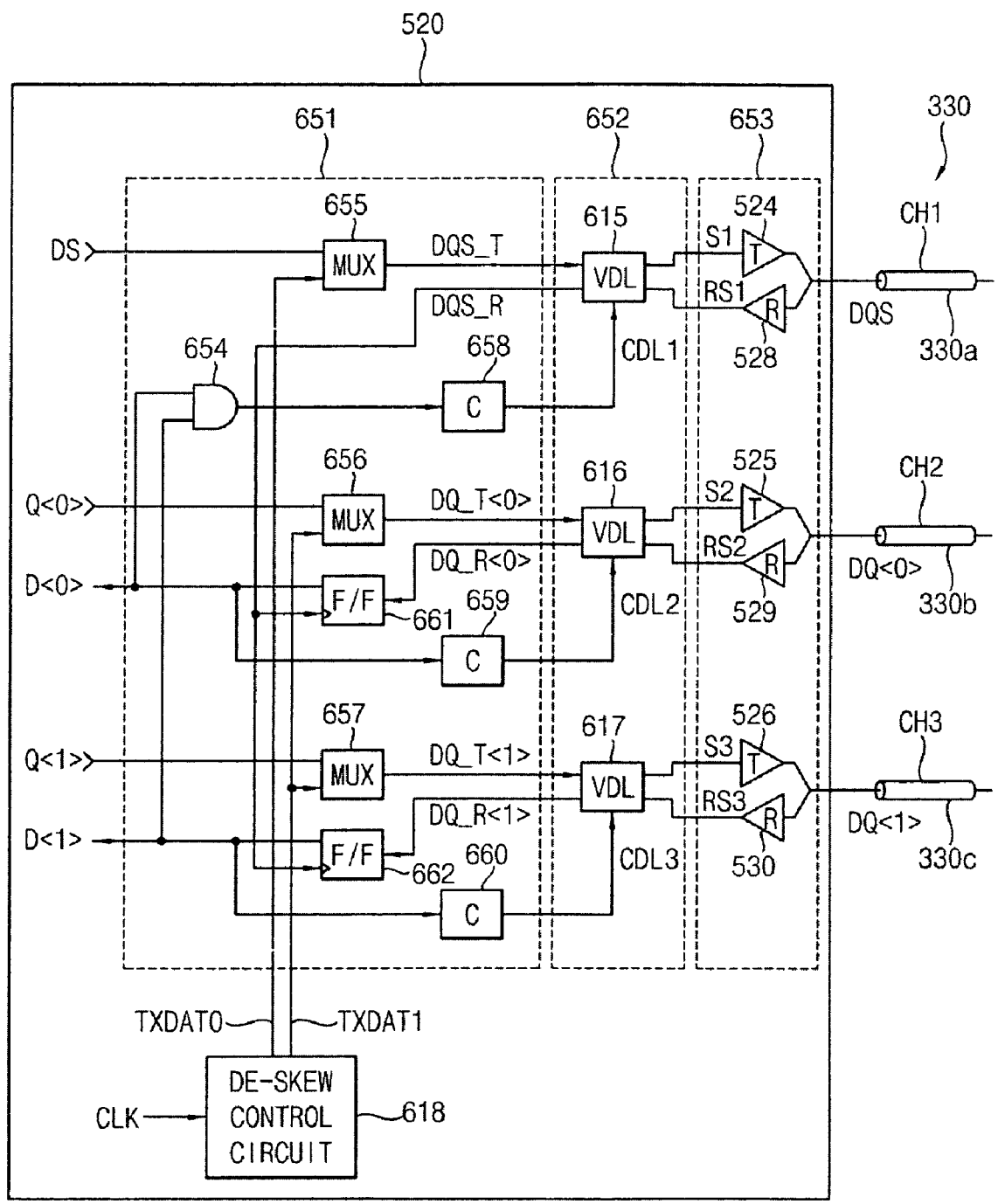
FIG. 8 is a schematic block diagram illustrating details of delay and skew processing circuitry in a testing circuit, according to an embodiment of the inventive concept.

FIG. 8 is a schematic block diagram illustrating details of the delay and skew processing circuitry in the testing circuit 520 according to an embodiment of the inventive concept. Referring to FIG. 8, the testing circuit includes transmit/ receive circuitry 653 for transmitting and receiving signals to and from the communication channels 330, including, but not limited to, the DSQ channel 330a, the DQ<0> channel 330b and the DQ<1> channel 330c. It is noted that for ease of illustration, only two DQ channels are shown in FIG. 8. It will be understood that the inventive concept is applicable to any number of DQ channels. The transmit/receive circuitry 653 includes the transmit circuits 524, 525, 526 and receive circuits 528, 529, 530, described above. The testing circuit 520 also includes the delay circuitry 652 which includes asynchronous variable delay line circuits 615, 616, 617, described above. The testing circuit 520 also includes delay control circuitry 651 and de-skew control circuitry 618. Description of elements with like reference numerals will not be repeated.

Referring to FIG. 8, the delay control circuitry 651 operates in the de-skew calibration mode to forward the test signal, which in one embodiment is a step signal, to the channels 330. In the normal mode, the de-skew control circuitry operates to forward operational signals, such as DQS, DQ<0>, DQ<1>, etc. to the channels 330. To that end, the de-skew control circuitry includes multiplexers 655, 656, 657, which are controlled to select either the calibration signal or the operational signals. The operational signals are applied to first inputs of the multiplexers 655, 656, 657, and the de-skew calibration signals are applied to second inputs of the multiplexers 655, 656, 657. Specifically, the de-skew calibration signal TXDAT0 is applied to the second input of the multiplexer 655 of the DQS channel, and the de-skew calibration signal TXDAT1 is applied to the second inputs of the multiplexers 656, 657 of the DQ<0> and DQ<1> channels, respectively. A mode selection signal, such as the CAL_EN signal described above, is applied to the select inputs of the multiplexers 655, 656, 657. During calibration, the CAL_EN signal is active high, such that the multiplexers 655, 656, 657 select the de-skew calibration signals. During normal mode, the CAL_EN signal is inactive low, such that the multiplexers 655, 656, 657 select the operational signals. During calibration, the TXDAT0 signal is output by multiplexer 655 to the delay line circuit 615 as signal DQS_T, and the TXDAT1 signal is output by multiplexers 656, 657 to the delay line circuits 616, 617, respectively, as signals DQ_T<0>, DQ_T<1>, respectively. The delayed signals are applied by the delay line circuits 615, 616, 617 to the transmit circuits 524, 525, 526 as calibration signals S1, S2, S3, respectively.

Signals returning from the receive ends of the channels 330a, 330b, 330c are applied to receive circuit comparators 528, 529, 530, respectively. The comparator outputs, indicating return of the reflected signals, are output to the delay line circuits 615, 616, 617 as signals RS1, RS2, RS3, respectively. The delay line circuits 615, 616, 617 apply delays to the signals as described above and output the delayed signals DQS_R, DQ_R<0>, DQ_R<1>. The delayed DQ channel signals DQ<0>, DQ<1> are applied to the data inputs of flip-flops 661, 662, respectively. The delayed DQS channel signal DQS_R is applied to the edge-triggered clock inputs of the flip-flops 661, 662, such that when the DQS_R signal returns, it clocks the DQ_R<0>, DQ_R<1> signals to the outputs of the flip-flops 661, 662, respectively. Each channel includes a delay and calibration control circuit 658, 659, 660. The delay and calibration control circuit 658 for the DQS channel receives the output of AND gate 654, and the delay and calibration control circuits 659, 660 for the DQ<0> and DQ<1> channels, respectively, receive the outputs of the flip-flops 661, 662, respectively. The delay and calibration control circuits generate the appropriate delay control signals for their respective channels based on these received signals, which indicate the relative signal propagation time differences among the channels, and apply the delays to the delay line circuits 615, 616, 617 in delay control signals CDL1, CDL2, CDL3, respectively, to set the delays of the channels to eliminate channel skew.

The flip-flops 661, 662 operate in accordance with the inventive concept according to the following description. When the DQS_R signal transitions from an active low state to an active high state, receipt of the returning reflected DQS signal, with the delay from the delay circuit 615 applied to the signal, is indicated. This transition clocks the DQ_R<0>, DQ_R<1> signals to the outputs of their respective flip-flops 661, 662. If the calibration signals that were transmitted into the DQ channels to the receive ends have returned, with their respective delay applied by delay circuits 616, 617, by the time the DQS_R signal clocks the flip-flops, then the DQ_R<0>, DQ_R<1> signals will be in active high states, and, therefore, the outputs of the flip-flops 661, 662 applied to the delay and calibration control circuits 659, 660 will be high. If, on the other hand, the DQ_R<0>, DQ_R<1> signals are low, indicating that their respective delayed calibration signals have not yet returned, then the signals clocked through the flip-flops 661, 662 to the delay and calibration control circuits 616, 617 will be low. Thus, the DQS_R signal, by clocking the flip-flops 661, 662, samples the states of the DQ_R<0>, DQ-R<1> signals to determine whether their respective calibration signals have been reflected back by the time the DQS calibration signal is reflected back. In this way, each of the relative propagation time differences between the DQS channel and the DQ channels is detected. Generally, each of the DQ_R<0>, DQ_R<1> can be either high or low when the DQS_R signal performs the sampling, i.e., clocks the flip-flops 661, 662. If a DQ_R signal value is low at the time of the sampling, then that channel has a longer propagation time than the DQS channel, and, if the signal is high, then that channel has a shorter propagation time than the DQS channel. Each of these indications for each of the DQ channels, i.e., whether the channel has a longer (DQ_R=low) or shorter (DQ_R=high) propagation time, is applied to the input of the respective delay and calibration control circuit 659, 660 for the channel. Based on these indications, the calibration control signals CDL2, CDL3 are generated and applied to delay line circuits 616, 617, for the DQ<0>, DQ<1> channels, respectively, to either increase or decrease the delay of that channel, as appropriate. The outputs of the flip-flops 661, 662 are also applied to inputs of an AND gate 654, which performs a logical AND operation on the signals from the flip-flops 661, 662 and applies the result of the AND operation to the delay and calibration control circuit 658, so that the delay control signal CDL1 can be generated and applied to the delay line circuit 615 for the DQS channel. The output of the AND gate 654 is low unless both (all) of the DQ_R signals are high. That is, the signal applied to the delay and calibration control circuit 658 for the DQS channel is low if any of the DQ_R signals is low, i.e., if any of the DQ channels has a longer propagation time than that of the DQS channel. The output of the AND gate, and, therefore, the signal applied to the delay and calibration control circuit 658 for the DQS channel, is high only if all of the DQ_R signals are high, thus indicating that the propagation time of the DQS channel is longer that that of all of the DQ channels. The delay and calibration control circuit 658 for the DQS channel uses this signal to adjust the delay in the delay line 615 for the DQS channel, depending on the desired relationship between the propagation times of the DQS channel and the DQ channels. According to an aspect of the inventive concept, the delay in the delay line 615 for the DQS channel is set to introduce a 90-degree delay phase shift with respect to the DQ channels to accommodate the DDR3 specifications. Further delay adjustment can be achieved via the delay and calibration control circuit 658 based on the desired relative propagation times for the channels.

Figure 9A:
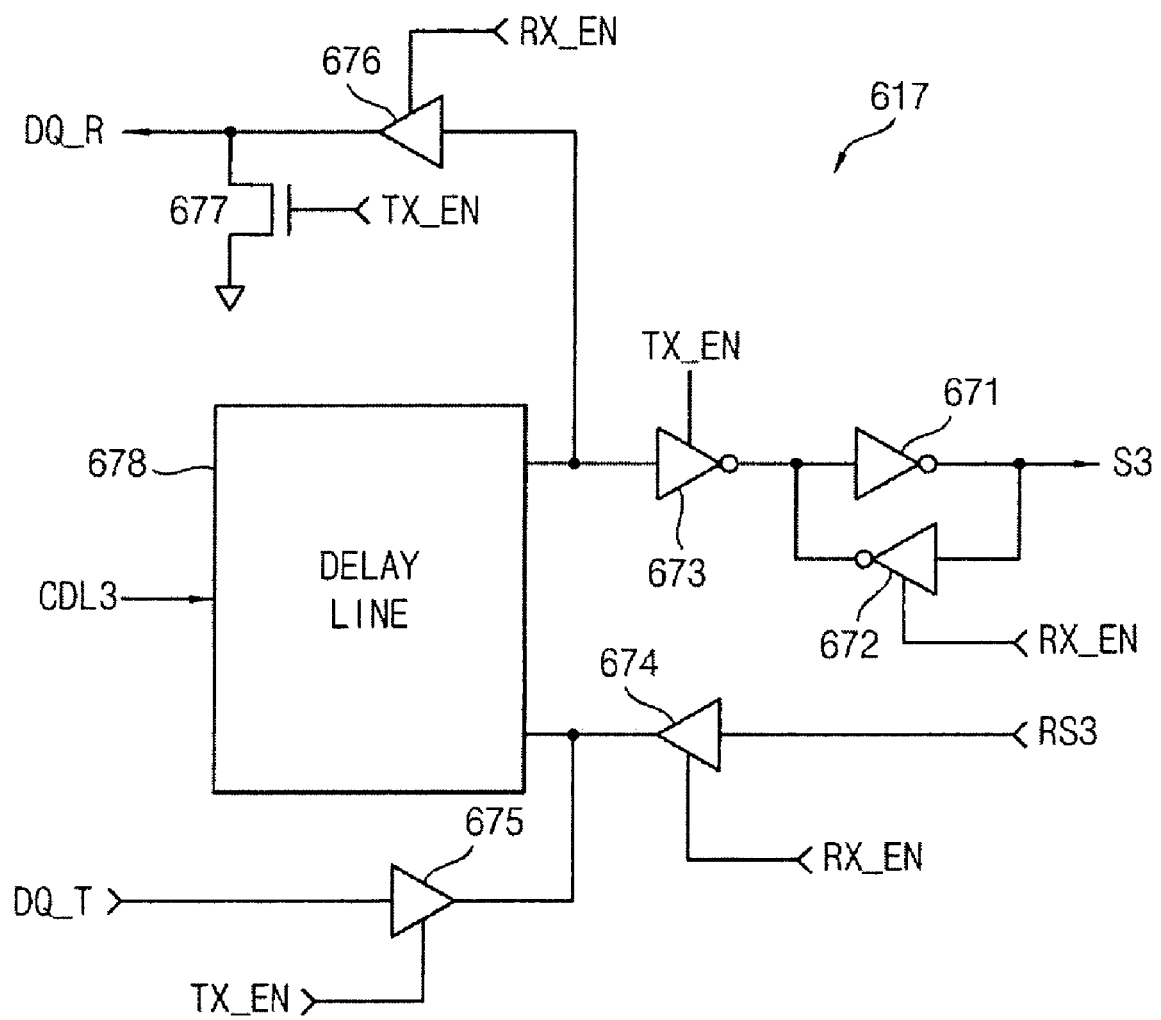
FIG. 9A contains a detailed schematic block diagram of one of the delay circuits of FIG. 8, according to an embodiment of the inventive concept.

FIG. 9A contains a detailed schematic block diagram of one of the delay circuits, specifically, delay circuit 617, of FIG. 8, according to an embodiment of the inventive concept. The RS3 input signal is received by the asynchronous delay line 678 through a tri-state controllable pass buffer circuit 674, which is controlled to allow the signal RS3 to be applied to the delay line 678 by the receive enable signal RX_EN. The output of the delay line 678 is transferred to the channel through the tri-state inverting buffer 673 and inverting buffer 671. When the transmit enable control signal is active high, the tri-state buffer 673 is enabled, such that the output signal is transferred to the channel as signal S3. Tri-state inverting buffer 672 is enabled when the receive enable signal RX_EN is active high. The output of the delay line is also connected to another tri-state pass buffer 676, which is controlled by the receive enable control signal RX_EN. When a signal is received from the channel and the RX_EN signal is active high, the buffer 676 is enabled such that the signal appears at the output of the buffer 676 as the signal DQ_R. When a signal is being transmitted to the channel and the transmit enable signal is active high, the FET 677 disables the output of the buffer 676. The DQ_T signal is applied to the input of another tri-state pass buffer 675. When the DQ_T signal is to be transferred to the channel for transmission, the TX_EN signal is active high, such that the DQ_T is applied by the buffer 675 to the delay line 678. The delay in the delay line is set according to the inventive concept by the delay control signal CDL3.

Figure 9B:
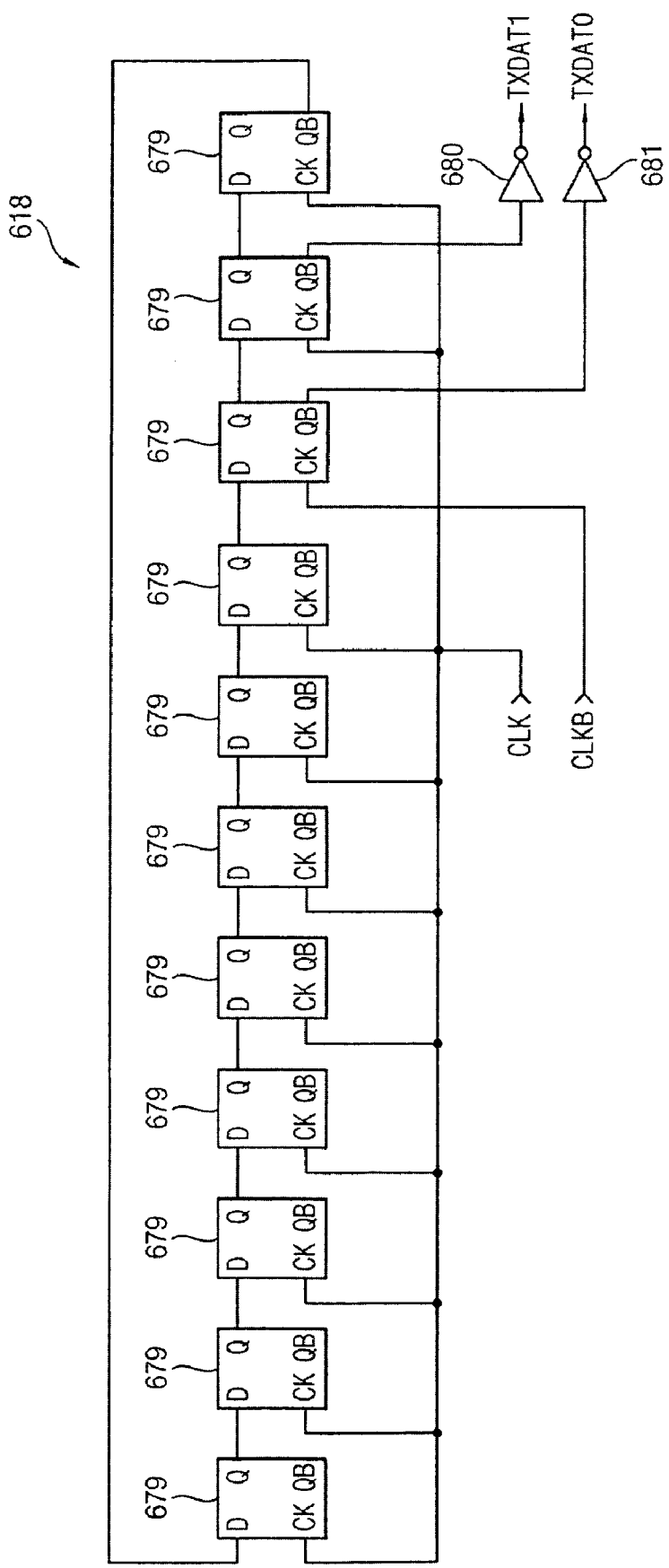
FIG. 9B is a detailed schematic block diagram of de-skew control circuitry of FIG. 8, according to an embodiment of the inventive concept.

FIG. 9B is a detailed schematic block diagram of the de-skew control circuit of FIG. 8, which generates the de-skew calibration signals TXDAT0 and TXDAT1, according to an embodiment of the inventive concept. Referring to FIG. 9B, the de-skew control circuit 618 includes a plurality of D flip-flop stages 679, for example, eleven D flip-flop stages 679 as shown in FIG. 9B. The Q output of each of the first through tenth stages is applied to the D input of the next succeeding stage. The QB output of the eleventh stage is connected to the D input of the first stage. The TXDAT0 signal is taken from the QB output of the ninth stage, through an inverting buffer 681, and the TXDAT1 signal is taken from the QB output of the tenth stage, through an inverting buffer 680. The system clock signal CLK is applied to the CK input of the eighth stage, and the inverted clock signal CLKB is applied to the CK input of the ninth stage. As a result, the TXDAT0 and TXDAT1 signals periodically change states every ten cycles of the clock signal CLK and have a 180-degree phase difference.

Figure 10A:
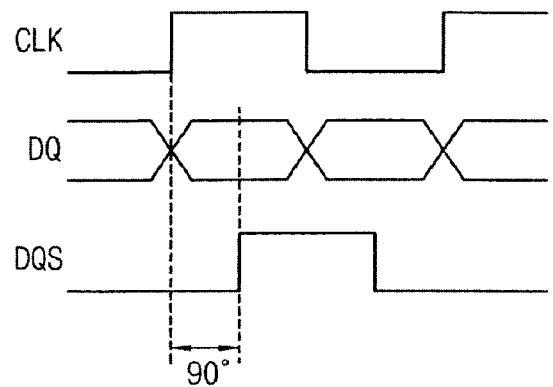
FIGS. 10A through 10C are timing diagrams illustrating various signals in the system of the inventive concept, in particular, the testing circuit of FIGS. 7A and 8.
Figure 10B:
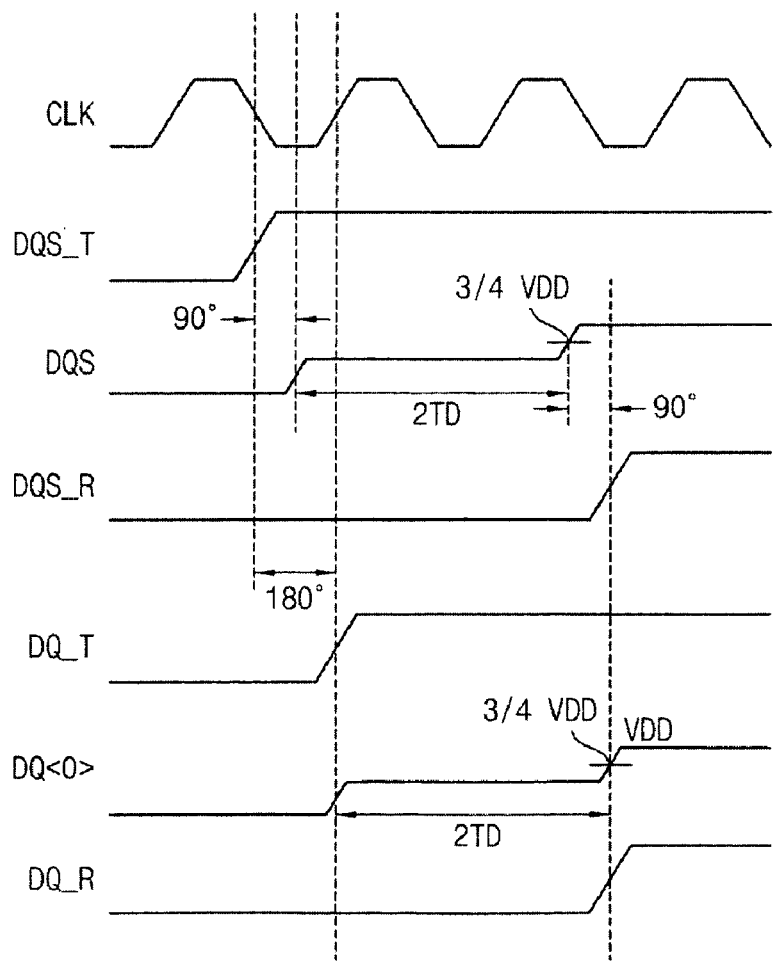
Figure 10C:
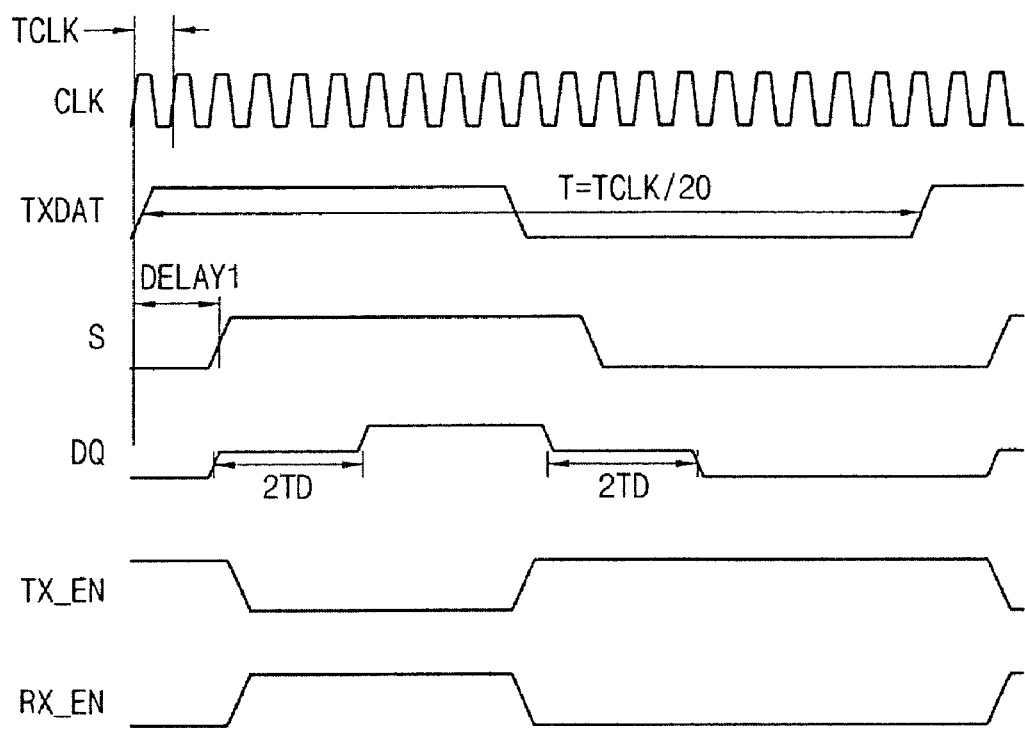

FIGS. 10A through 10C are timing diagrams illustrating various signals in the system of the inventive concept, in particular, the testing circuit 520 of FIGS. 7A and 8. Referring to FIG. 10A, the clock signal CLK, the DQ signals and the DQS are illustrated. The timing diagram of FIG. 10A shows the 90-degree delayed phase shift of the DQS signal with respect to the DQ data signals. As described above, this built-in 90-degree phase delay is useful and advantageous when the testing circuitry described herein is configured as a memory controller for controlling a memory, such as a DDR3 DRAM memory, according to the inventive concept.

FIG. 10B illustrates the relative timing of the DQS, DQS_T, DQS_R, DQ<0>, DQ_T, DQ_R, and CLK signals. As shown in the timing diagram and described above, the DQS_T signal is 180 degrees advanced with respect to the DQ_T signal. Also, the DQS signal is shown to have the 90-degree phase delay with respect to the DQ<0> signal, in accordance with the inventive concept. Again, this phase delay is useful and advantageous when the inventive concept is applied to a memory controller used to control a memory such as a DDR3 DRAM memory. The reference to 2TD refers to the propagation time in a signal transmitted from the transmit ends of the channels to the receive ends of the channels and back to the transmit ends of the channels.

FIG. 10C illustrates the relative timing of the CLK signal, the TXDAT (TXDAT0 or TXDAT1) signal, the S (S2 or S3) signal, the DQ (DQ<0> or DQ<1>) signal, the TX_EN signal and the RX_EN signal. As described above, the S signal is delayed by a DELAY1 from the TXDAT signal. Also, the TXDAT signal is a periodic signal which changes states for every ten periods of the CLK signal, i.e., the period of the TXDAT signal is 20 times the period of the CLK signal.

Figure 10D:
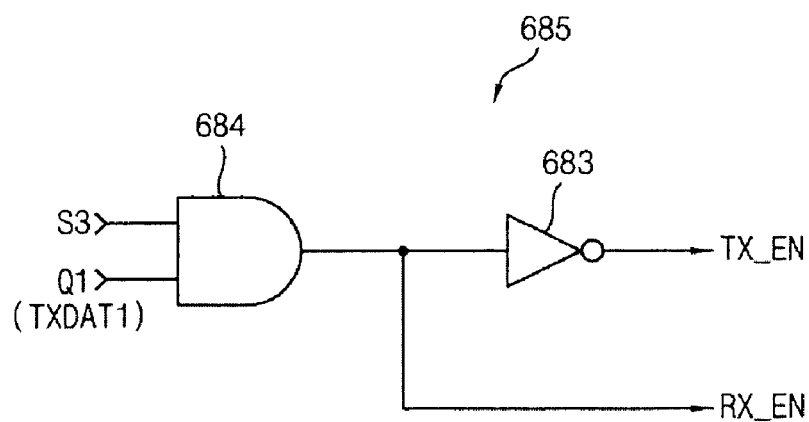
FIG. 10D is a schematic block diagram which illustrates a circuit for generating transmit enable and receive enable control signals, according to an embodiment of the inventive concept.

FIG. 10D is a schematic block diagram which illustrates a circuit 685 for generating the TX_EN and RX_EN signals, according to an embodiment of the inventive concept. Referring to the timing diagram of FIG. 10C and the block diagram of FIG. 10D, the circuit 685 includes an AND gate 684, which receives the signal S3 and the TXDAT1 signal. The result of the AND operation is output as the RX_EN signal. The output signal from the AND gate 684 is also applied to an inverting buffer 683, which outputs the inverted signal as the TX_EN signal.

As described throughout this description of the inventive concept, one of the features of the inventive concept is that a 90-degree phase shift is introduced into the channel that carries the DQS data strobe signal, with respect to the channels that carry the DQ signals. This feature of the inventive concept makes it applicable for use in a memory controller for controlling a memory such as a DDR3 memory, as described herein. In such a memory controller, there is no need for special PLL or DLL circuitry to provide the required phase shift, as in conventional memory controllers. However, it should be noted that the inventive concept is applicable to any phase shift, i.e., not just the 90-degree phase shift. For example, the inventive concept is applicable to a system operating according to, for example, the graphics double data rate, version 5 (GDDR5) specifications, or the extreme data rate (XDR) specifications or the quad data rate (QDR) specifications. In such systems, a 45-degree phase shift between the DQS data strobe signals and the DQ data signals is required. According to the inventive concept, the phase shift in the delay line associated with the DQS channel can be set to 45 degrees. The skew reduction/elimination according to the inventive concept can be applied as described herein to eliminate skew among the channels.

Figure 11:
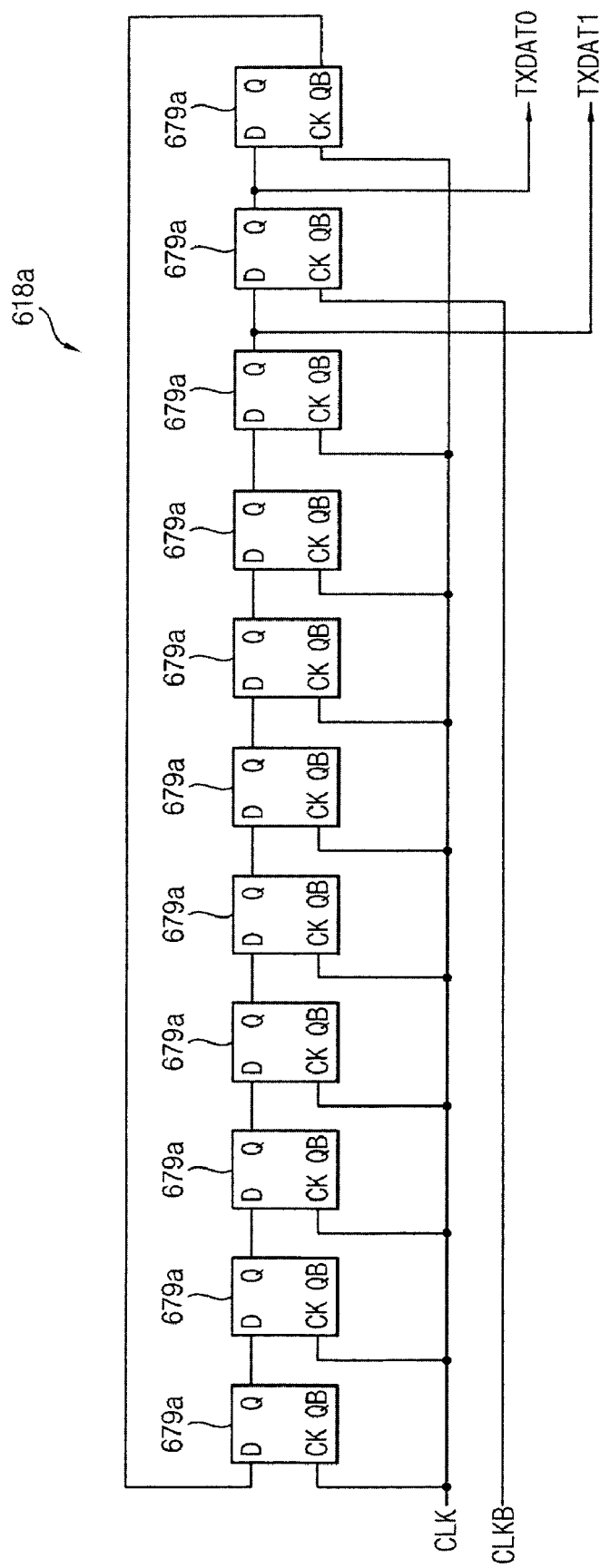
FIG. 11 is a schematic block diagram of de-skew control circuitry in which the signal TXDAT0 has 90-degree advanced phase with respect to TXDAT1, according to an embodiment of the inventive concept.

Referring back to FIGS. 8 and 9B, in a case in which a 45-degree phase shift is to be used, the two de-skew calibration signals TXDAT0 and TXDAT1 are generated such that TXDAT0 has 90-degree advanced phase compared to TXDAT1. This is accomplished by connecting the flip-flops of the de-skew control circuit of FIGS. 8 and 9B in a different configuration than that shown in those figures. Specifically, FIG. 11 is a schematic block diagram of a de-skew control circuit 618a in which the signal TXDAT0 has 90-degree advanced phase with respect to TXDAT1, according to an embodiment of the inventive concept. Referring to FIG. 11, the de-skew control circuit 618a includes a plurality of D flip-flop stages 679a, for example, eleven D flip-flop stages 679a as shown in FIG. 11. The Q output of each of the first through tenth stages is applied to the D input of the next succeeding stage. The QB output of the eleventh stage is connected to the D input of the first stage. The TXDAT0 signal is taken from the Q output of the tenth stage, and the TXDAT1 signal is taken from the Q output of the ninth stage. The system clock signal CLK is applied to the CK input of all of the stages except the tenth, and the inverted clock signal CLKB is applied to the CK input of the tenth stage. As a result, the TXDAT0 and TXDAT1 signals periodically change states and have a 90-degree phase difference.

Figure 12:
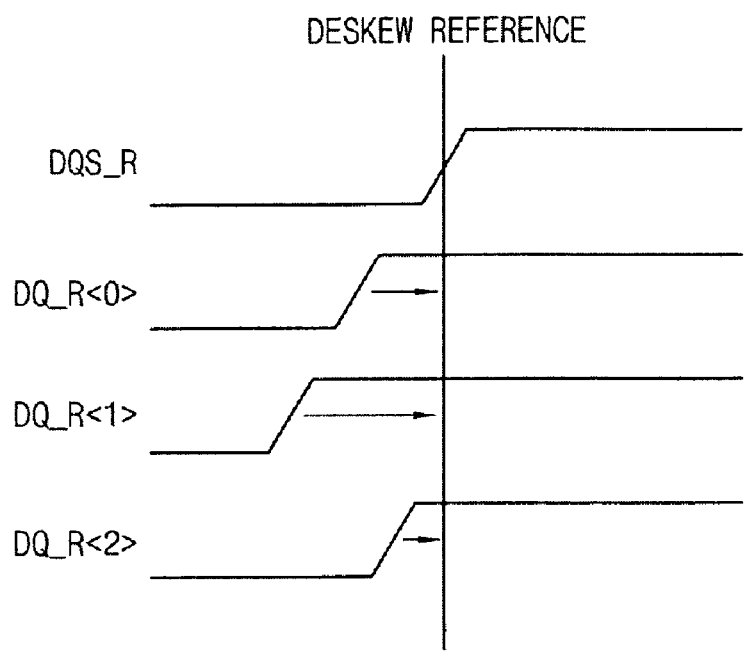
FIGS. 12, 13A, 13B, 14A, 14B contain timing diagrams illustrating the channel de-skewing process according to the inventive process for different cases. Specifically.
Figure 13A:
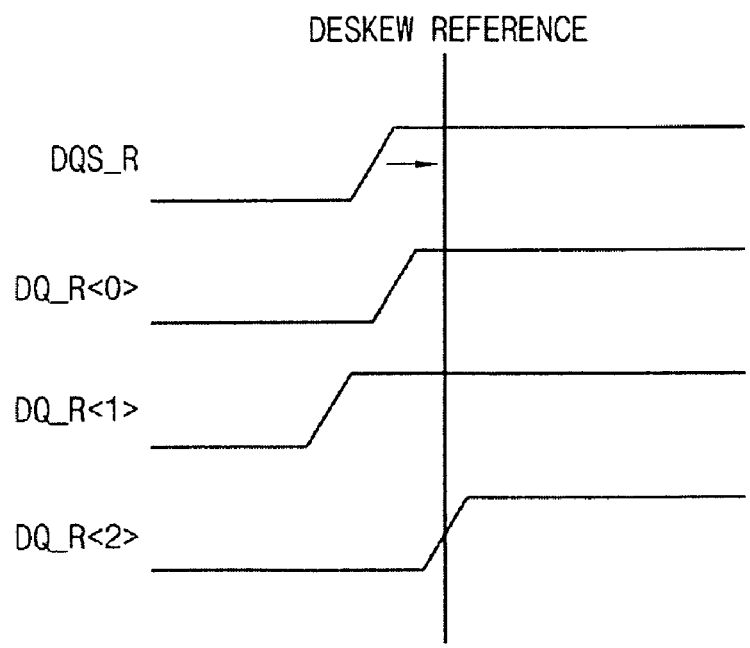
Figure 13B:
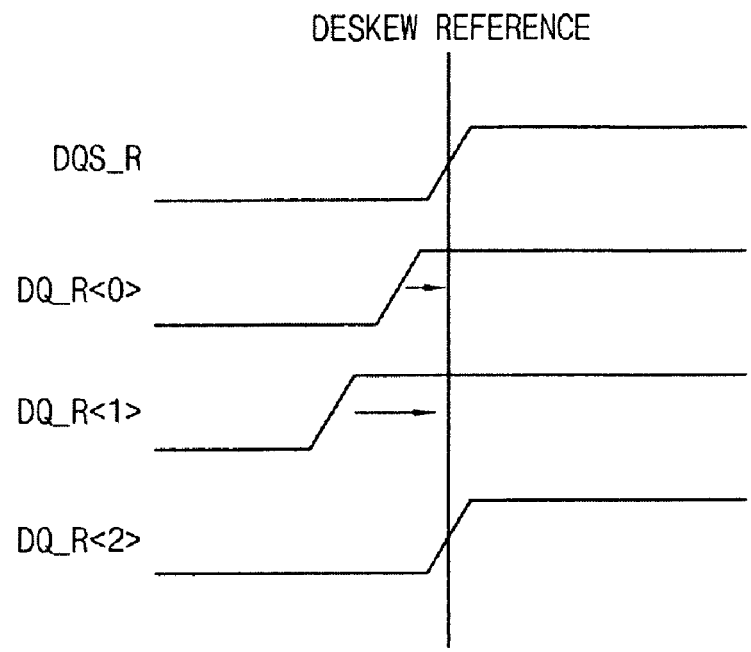
Figure 14A:
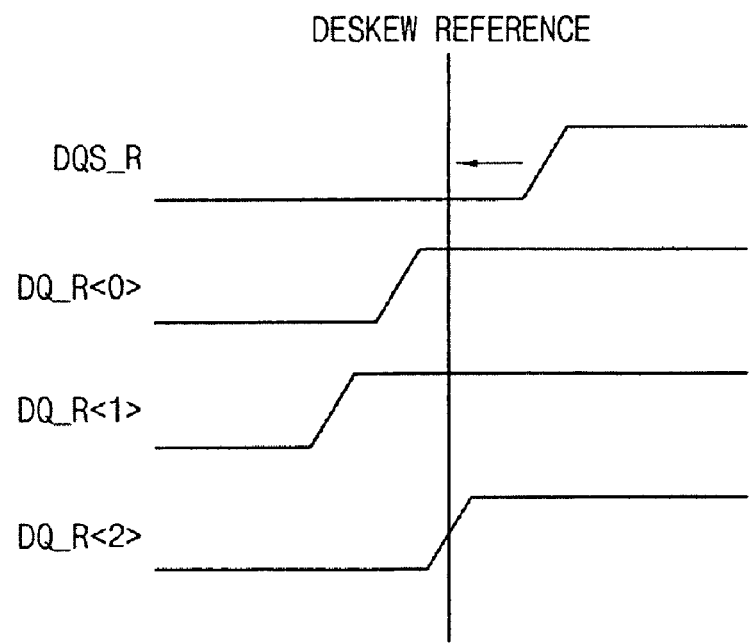
Figure 14B:
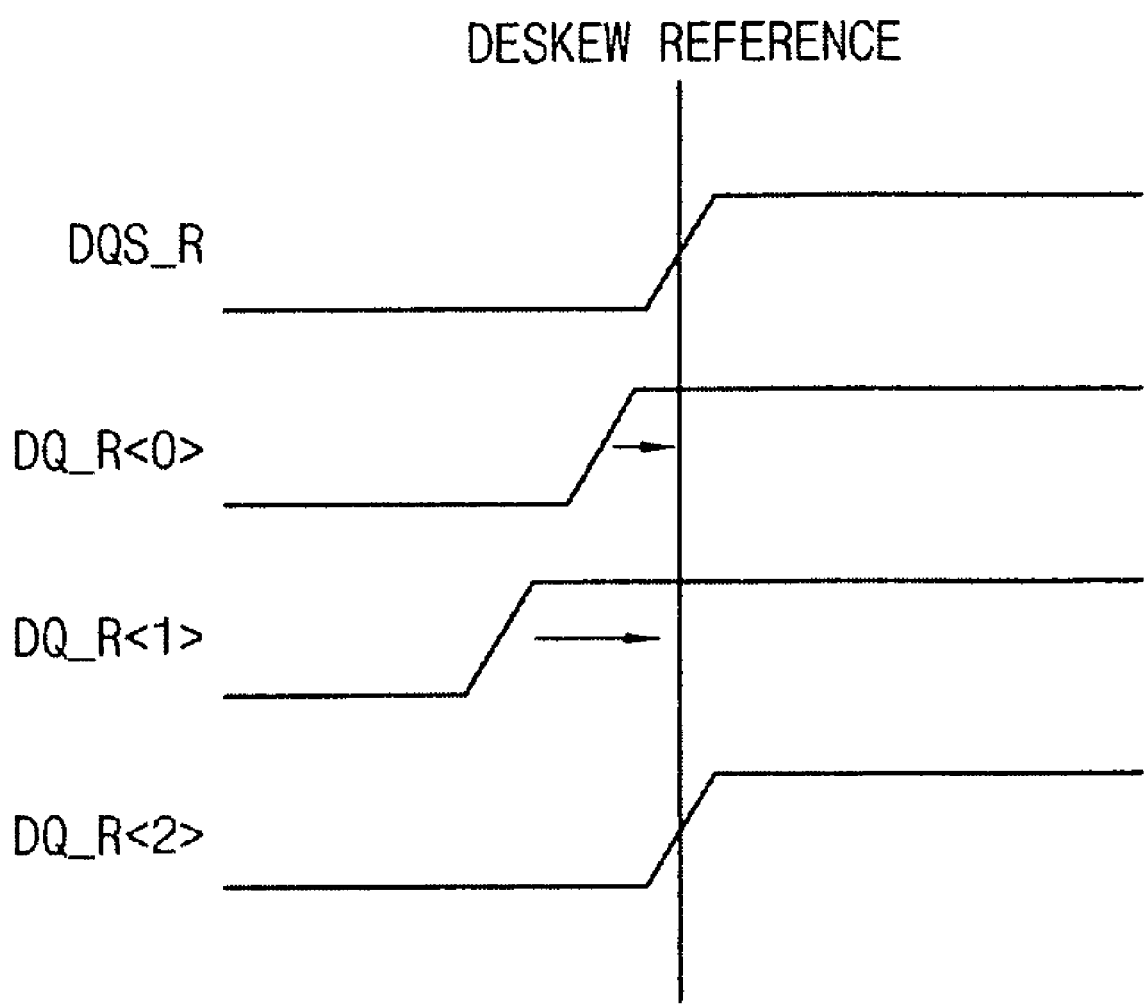

FIGS. 12, 13A, 13B, 14A, 14B contain timing diagrams illustrating the channel de-skewing process according to the inventive process for different cases. Specifically, FIG. 12 illustrates the basic de-skewing process of the inventive concept. FIGS. 13A and 13B illustrate the de-skewing process for the case in which the DQS channel has a lower propagation time than the DQ channels and is referred to as the short channel case. FIGS. 14A and 14B illustrate the de-skewing process for the case in which the DQS channel has a higher propagation time than the DQ channels and is referred to as the long channel case. It is noted that the timing diagrams of FIGS. 12, 13A, 13B, 14A, 14B illustrate three DQ channels, namely, DQ<0>, DQ<1> and DQ<2>. It is noted that three channels are shown only for ease of illustration, as in the foregoing description and drawings in which only two DQ channels were shown. It will be understood that the inventive concept is applicable to any number of DQ channels.

Referring to FIG. 12, the DQS_R signal is shown arriving at a de-skew reference time. It is desirable that all of the DQS_R, DQ_R<0>, DQ_R<1>, DQ_R<2> arrive simultaneously at the de-skew reference time such that skew among the channels is eliminated. Therefore, as illustrated by the arrows in FIG. 12, it is desirable to adjust delay in the DQ<0>, DQ<1>, DQ<2> channels such that they all arrive at the de-skew reference time.

The skew elimination process according to the inventive concept is generally carried out in two steps, namely, a coarse tuning step and a fine tuning step. During the coarse tuning step, the delay in the DQS channel is adjusted first to align it in time with at least one of the DQ channels. When this is completed, the fine tuning step is carried out to adjust the delay in the DQ channels such that they are all aligned with the DQS channel and with each other.

Referring to FIG. 13A, the DQS short channel case is illustrated. In this case, when the DQS_R signal transitions to the high state to clock the flip-flops, e.g., flip-flops 661, 662 of FIG. 8, at least one of the DQ_R signals has not yet transitioned to a high state, such that the output of AND gate 654 is low, indicating that the DQS channel has a shorter propagation time than at least one of the DQ channels. To remedy this, during the coarse tuning step, additional delay is introduced into the delay line 615 in the DQS channel in response to the control signal from the delay and calibration control circuit 658, as illustrated by the arrow in FIG. 13A. This process continues repeatedly, with multiple calibration signals being transmitted through and reflected back through the channels and the delay in the DQS channel being increased until the output of the AND gate is active high, thus indicating that all of the DQ_R signals were high when the DQS_R signal arrived. In the particular example illustrated in FIG. 13A, this would occur when the DQS_R signal is substantially lined up with the DQ_R<2> signal, allowing for some delay associated with clocking the signal through its flip-flop. Thus, in this first coarse tuning step, the DQS channel is delayed to be aligned in time with the DQ channel having the longest propagation time, which in this case is DQ_R<2>.

Next, the fine tuning step is performed to align all of the DQ_R signals in time with the DQS_R signal and with each other, as illustrated by the arrows in FIG. 13B. As shown in FIG. 13B, after the coarse tuning step, the DQS_R signal is aligned in time with the DQ_R<2> signal. As calibration continues with calibration signals being repeatedly transmitted through the channels and the reflected signals being detected upon their return, the DQS_R signal continues to clock the DQ_R<0>, DQ_R<1>, DQ_R<2> signals through their respective flip-flops, the outputs of the flip-flops being applied to respective delay and calibration control circuits, e.g., 659, 660 in FIG. 8. Because the DQS_R signal transitions to active high after the DQ_R<0> and DQ_R<1> signals transition to active high, the high outputs of their flip-flops are applied to their respective delay and calibration control circuits, which generate and forward delay control signals to their respective delay line circuits to increase the delay in the DQ<0> and DQ<1> channels. Because the DQS_R and DQ_R<2> are already aligned in time, no change in the delay for those channels is effected. This process continues until each of the signals DQ_R<0> and DQ_R<1> transitions to active low, indicating that they no longer arrive before the DQS_R signal clocking their flip-flops. At this point, all of the DQS_R, DQ_R<0>, DQ_R<1> and DQ_R<2> are aligned in time. As a result, skew among the channels, caused by different propagation times in the channels, is eliminated.

Referring to FIG. 14A, the DQS long channel case is illustrated. In this case, when the DQS_R signal transitions to the high state to clock the flip-flops, e.g., flip-flops 661, 662 of FIG. 8, all of the DQ_R signals have transitioned to a high state, such that the output of AND gate 654 is high, indicating that the DQS channel has a longer propagation time than all of the DQ channels. To remedy this, during the coarse tuning step, a reduction in delay is introduced into the delay line 615 in the DQS channel in response to the control signal from the delay and calibration control circuit 658, as illustrated by the arrow in FIG. 14A. This process continues repeatedly, with multiple calibration signals being transmitted through and reflected back through the channels and the delay in the DQS channel being decreased until the output of the AND gate is inactive low, thus indicating that at least one of the DQ_R signals was low when the DQS_R signal arrived. In the particular example illustrated in FIG. 14A, this would occur when the DQS_R signal is substantially lined up with the DQ_R<2> signal, allowing for some delay associated with clocking the signal through its flip-flop. Thus, in this first coarse tuning step, delay in the DQS channel is reduced such that the DQS_R signal is aligned in time with the DQ channel having the shortest propagation time, which in this case is DQ_R<2>.

Next, the fine tuning step is performed to align all of the DQ_R signals in time with the DQS_R signal and with each other, as illustrated by the arrows in FIG. 14B. As shown in FIG. 14B, after the coarse tuning step, the DQS_R signal is aligned in time with the DQ_R<2> signal. As calibration continues with calibration signals being repeatedly transmitted through the channels and the reflected signals being detected upon their return, the DQS_R signal continues to clock the DQ_R<0>, DQ_R<1>, DQ_R<2> signals through their respective flip-flops, the outputs of the flip-flops being applied to respective delay and calibration control circuits, e.g., 659, 660 in FIG. 8. Because the DQS_R signal transitions back to active high after the DQ_R<0> and DQ_R<1> signals transition to active high, the high outputs of their flip-flops are applied to their respective delay and calibration control circuits, which generate and forward delay control signals to their respective delay line circuits to increase the delay in the DQ<0> and DQ<1> channels. Because the DQS_R and DQ_R<2> are already aligned in time, no change in the delay for those channels is effected. This process continues until each of the signals DQ_R<0> and DQ_R<1> transitions to active low, indicating that they no longer arrive before the DQS_R signal clocking their flip-flops. At this point, all of the DQS_R, DQ_R<0>, DQ_R<1> and DQ_R<2> are aligned in time. As a result, skew among the channels, caused by different propagation times in the channels, is eliminated.

FIG. 15 contains a flow chart of a method for reducing or eliminating skew among a plurality of communication channels, according to an embodiment of the inventive concept. Referring to FIG. 15, a reference signal, such as a step signal, is transmitted to input ends of the plurality of channels, in step 700. A plurality of reflected signals from the output ends of the channels is received at input ends of the channels, in step 710. Relative signal propagation time differences between the channels are detected based on the reflected signals, in step 720. Signal propagation delay is set in at least one of the channels based on the detected relative signal propagation time differences, in step 730.

Figure 16:
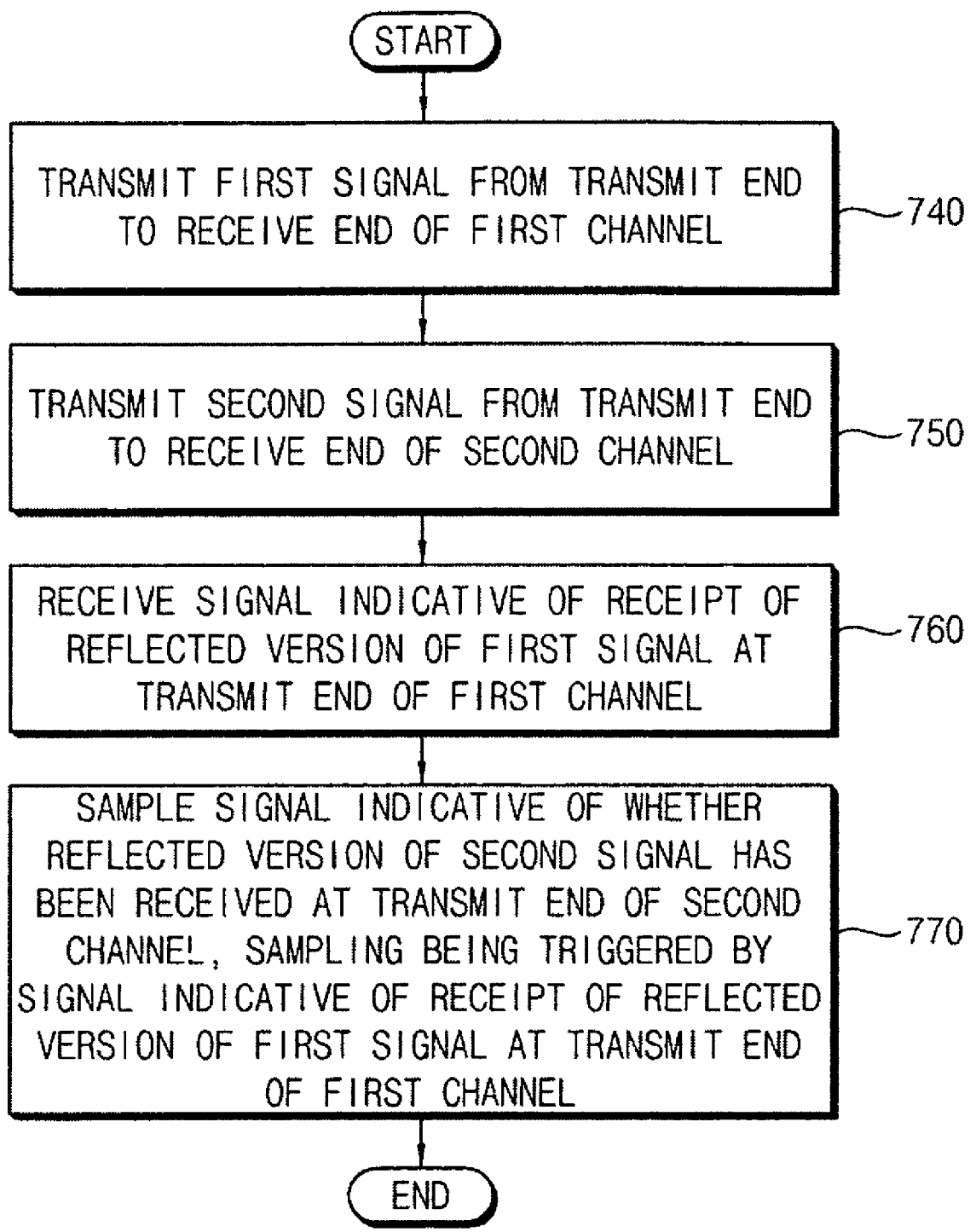
FIG. 16 contains a flow chart of a method for reducing or eliminating skew among a plurality of communication channels, according to another embodiment of the inventive concept.

FIG. 16 contains a flow chart of a method for reducing or eliminating skew among a plurality of communication channels, according to another embodiment of the inventive concept. Referring to FIG. 16, a first signal, such as a step signal, is transmitted from a transmit end to a receive end of a first channel, in step 740. A second signal, such as a step signal, is transmitted from a transmit end to a receive end of a second channel, in step 750. A signal indicative of receipt of a reflected version of the first signal at the transmit end of the first channel is received in step 760. In step 770, a signal indicative of whether a reflected version of the second signal has been received at the transmit end of the second channel is sampled. The sampling is triggered by the signal indicative of receipt of the reflected version of the first signal at the transmit end of the first channel.

Figure 17:
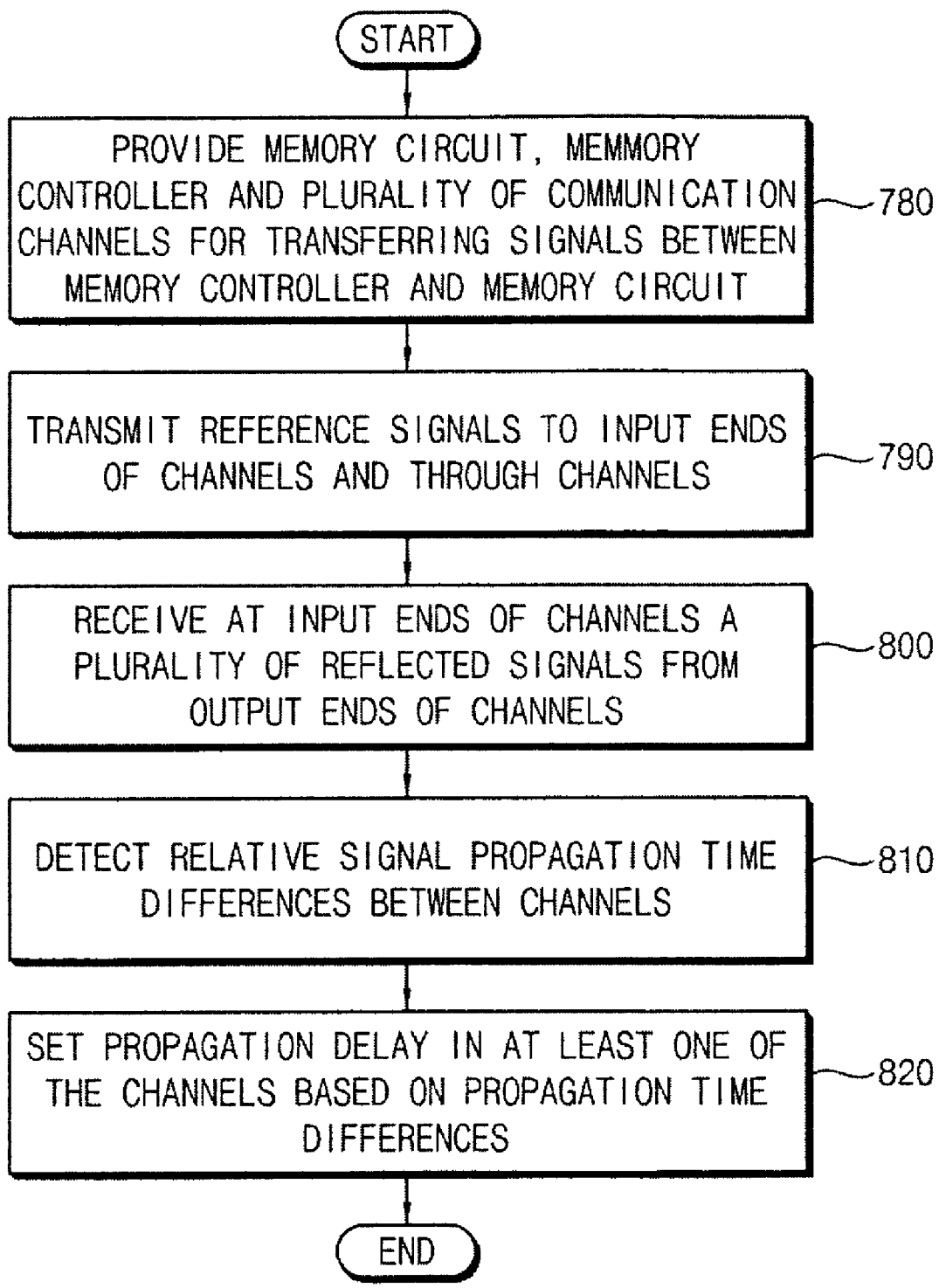
FIG. 17 contains a flow chart illustrating a method of controlling a memory circuit with reduced skew in communication channels used to communicate control and data signals with the memory circuit, according to an embodiment of the inventive concept.

FIG. 17 contains a flow chart illustrating a method of controlling a memory circuit with reduced skew in communication channels used to communicate control and data signals with the memory circuit, according to an embodiment of the inventive concept. A plurality of communication channels for transferring the signals between a memory controller and the memory circuit are provided in step 780. A reference signal, such as a step signal, is transmitted to input ends of the plurality of channels, in step 790. A plurality of reflected signals from the output ends of the channels is received at input ends of the channels, in step 800. Relative signal propagation time differences between the channels are detected based on the reflected signals, in step 810. Signal propagation delay is set in at least one of the channels based on the detected relative signal propagation time differences, in step 820.

Figure 18:
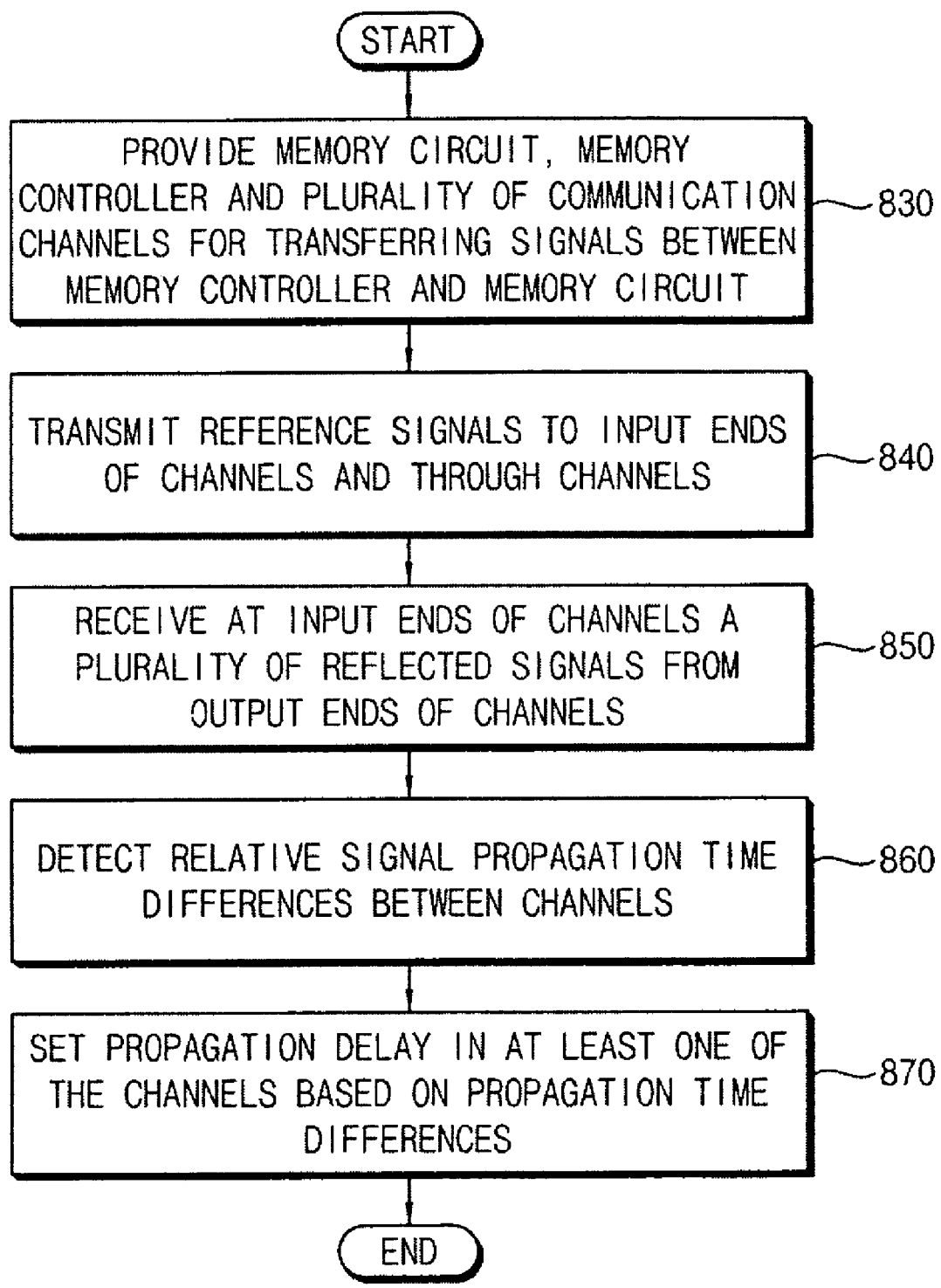
FIG. 18 contains a flow chart of a method in a memory system, in which a memory controller transfers control and data signals back and forth with a memory circuit over a plurality of communication channels and skew among the channels is reduced or eliminated, according to an embodiment of the inventive concept.

FIG. 18 contains a flow chart of a method in a memory system, in which a memory controller transfers control and data signals back and forth with a memory circuit over a plurality of communication channels and skew among the channels is reduced or eliminated, according to an embodiment of the inventive concept. According to the method, the memory circuit, memory controller and communication channels are provided, in step 830. A reference signal, such as a step signal, is transmitted to input ends of the plurality of channels, in step 840. A plurality of reflected signals from the output ends of the channels is received at input ends of the channels, in step 850. Relative signal propagation time differences between the channels are detected based on the reflected signals, in step 860. Signal propagation delay is set in at least one of the channels based on the detected relative signal propagation time differences, in step 870.

Figure 19A:
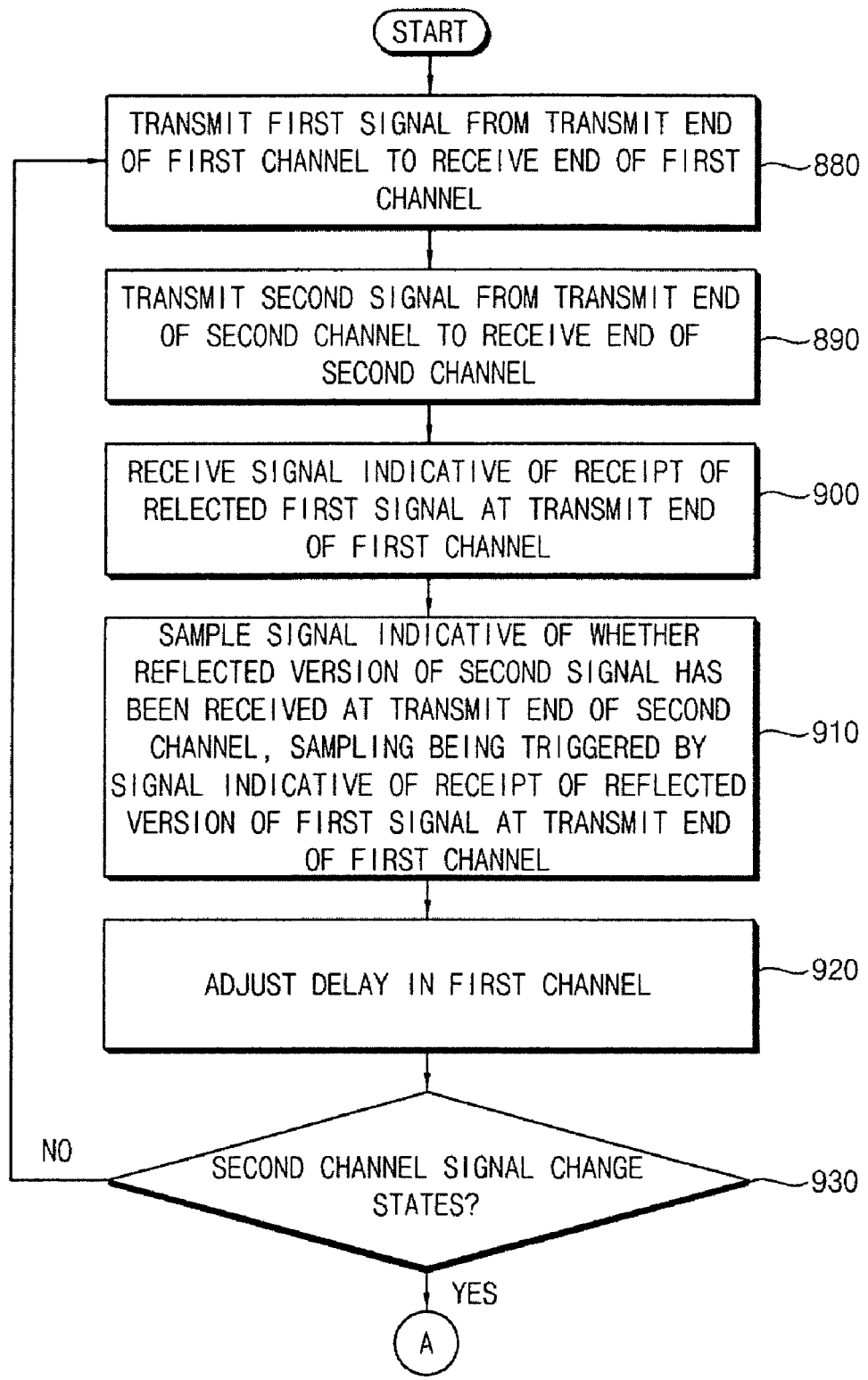
FIGS. 19A and 19B contain a flow chart of a method for reducing or eliminating skew among a plurality of communication channels, according to another embodiment of the inventive concept.
Figure 19B:
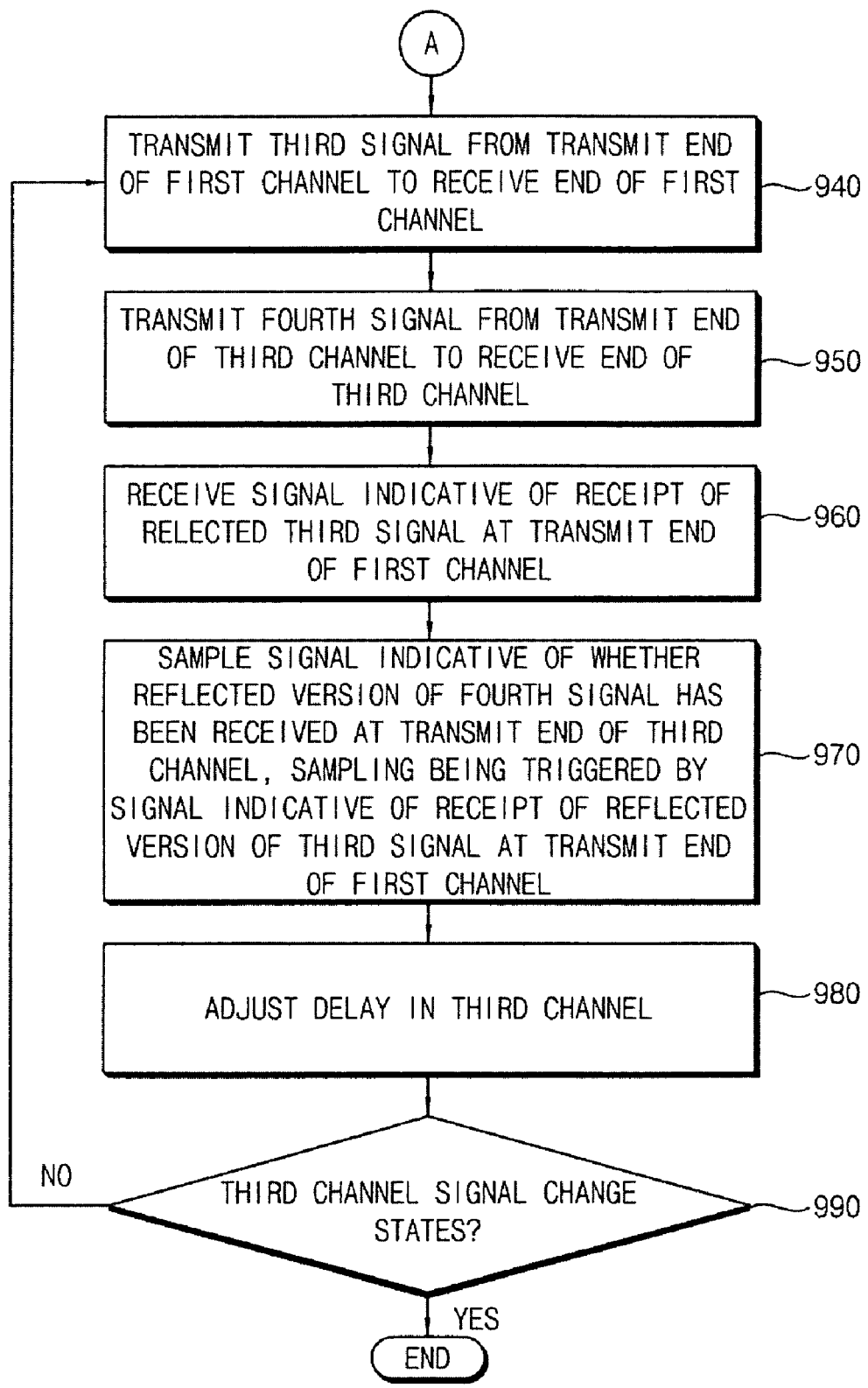

FIGS. 19A and 19B contain a flow chart of a method for reducing or eliminating skew among a plurality of communication channels, according to another embodiment of the inventive concept. According to the method, a first signal is transmitted from a transmit end of a first channel to a receive end of the first channel, in step 880. A second signal is transmitted from a transmit end to a receive end of a second channel, in step 890. A signal indicative of receipt of a reflected version of the first signal at the transmit end of the first channel is received, in step 900. In step 910, the signal indicative of whether a reflected version of the second signal has been received at the transmit end of the second channel is sampled. The sampling is triggered by the signal indicative of receipt of the reflected version of the first signal at the transmit end of the first channel. Delay in the first channel is adjusted in step 920. The process of steps 880 through 920 is repeated until the signal indicative of whether a reflected version of the second signal has been received at the transmit end of the second channel has changed states in response to the iterative adjustment to the delay in the first channel. To that end, in step 930, it is determined whether the signal has changed states. If it has not yet changed states, the steps 880 through 920 are repeated. When the signal does change states, indicating that the first signal and the second signal are aligned in time, the process continues to step 940.

This initial adjustment process of steps 880 through 930 is referred to herein as the coarse tuning process, during which the delay in the DQS channel, i.e., the first channel, is adjusted until the DQS channel and one of the DQ channels, i.e., the second channel, are aligned in time. As a result, skew between the first and second channels, i.e., the DQS channel and one of the DQ channels, is eliminated. After this coarse tuning process is determined to be complete in step 930, the fine tuning process, in which all of the DQ channels are adjusted to be aligned with the DQS channel and with each other begins in step 940. The fine tuning process illustrated in steps 940 through 990 is shown for only one other DQ channel, referred to in the flow chart as the third channel. The fine tuning process of steps 940 through 990 is repeated for each DQ channel.

In step 940, a third signal is transmitted from the transmit end of the first channel, e.g., the DQS channel, to the receive end of the first channel. In step 950, a fourth signal is transmitted from the transmit end of a third channel, i.e., another of the DQ channels, to a receive end of the third channel. In step 960, a signal indicative of receipt of a reflected version of the third signal at the transmit end of the first channel is received. In step 970, a signal indicative of whether a reflected version of the fourth signal has been received at the transmit end of the fourth channel is sampled. The sampling is triggered by the signal indicative of receipt of the reflected version of the third signal at the transmit end of the first channel. Delay in the third channel is adjusted in step 980. The process of steps 940 through 980 is repeated until the signal indicative of whether a reflected version of the fourth signal has been received at the transmit end of the third channel has changed states in response to the iterative adjustment to the delay in the third channel. To that end, in step 980, it is determined whether the signal has changed states. If it has not yet changed states, the steps 940 through 980 are repeated. When the signal does change states, indicating that the third signal and the fourth signal are aligned in time, the process ends. This fine tuning adjustment process of steps 940 through 980 continues is repeated for all of the other channels, i.e., all of the DQ channels, such that, when all of the channels are completed, then all of the reflected signals are aligned in time, meaning that skew among all of the channels has been eliminated.

Figure 20:
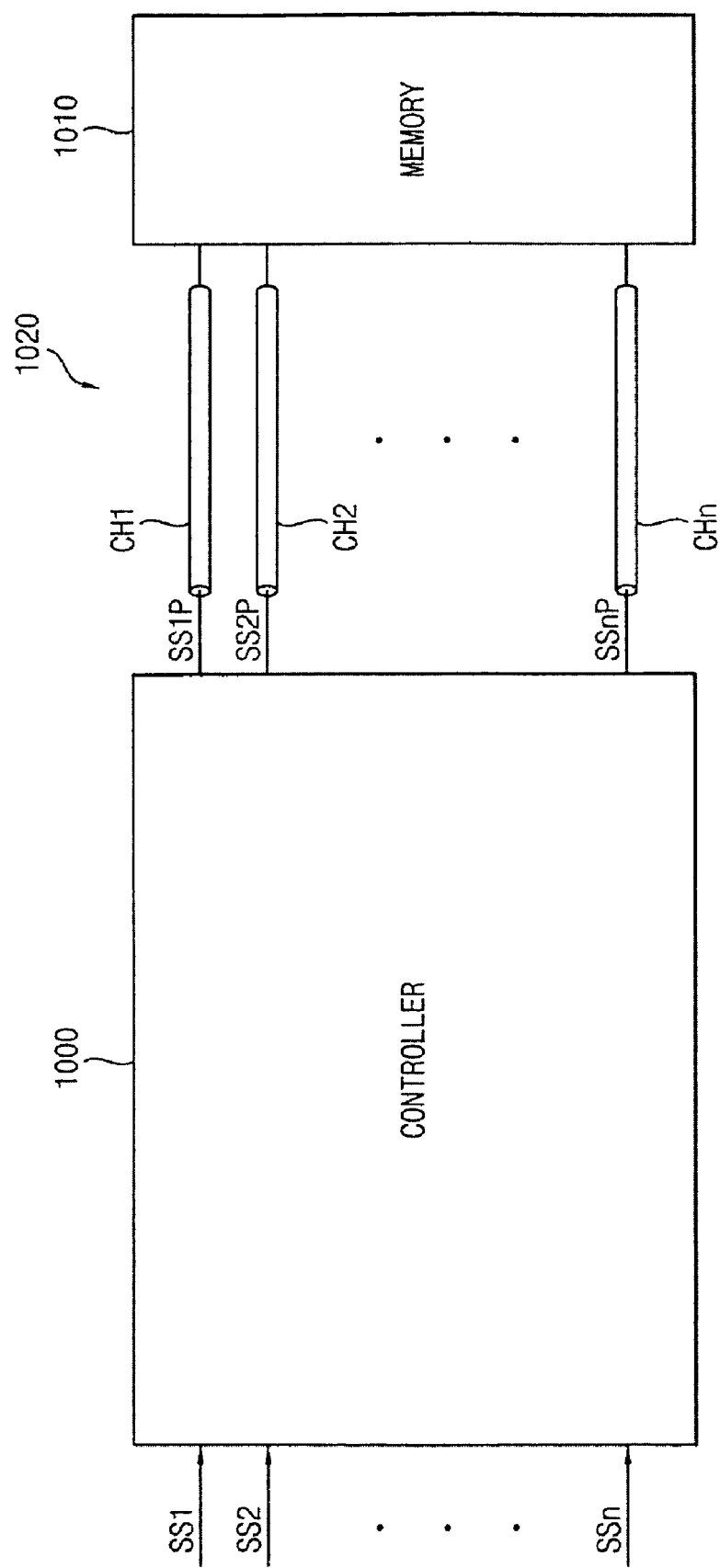
FIG. 20 is a schematic block diagram of a memory system using the de-skewing of the invention in a memory controller, according to an embodiment of the inventive concept.

As described above, the skew reduction approach of the inventive concept can be used in a memory testing environment in which the skew reduction is implemented in a BOT chip testing circuit which provides the interface between ATE and the memory device being tested. In addition, the de-skewing of the inventive concept can be implemented in a memory controller used to control the memory circuit. FIG. 20 is a schematic block diagram of a memory system using the de-skewing of the invention in a memory controller, according to an embodiment of the inventive concept. Referring to FIG. 20, the memory controller 1000 interfaces with the memory circuit 1010 via communication channels 1020. According to the inventive concept described herein, skew is reduced or eliminated in the channels 1020. Also, a desired predetermined phase shift can be introduced into the channels 1020 according to the inventive concept described herein. Control signals SS1, SS2, ..., SSn, which can be generated external to the memory controller 1000 or within the memory controller 1000, are used to generate corresponding signals SS1P, SS2P, ..., SSnP for transfer over the channels 1020 to the memory circuit 1020, with reduced or eliminated skew and the desired predetermined phase relationship.

Figure 21:
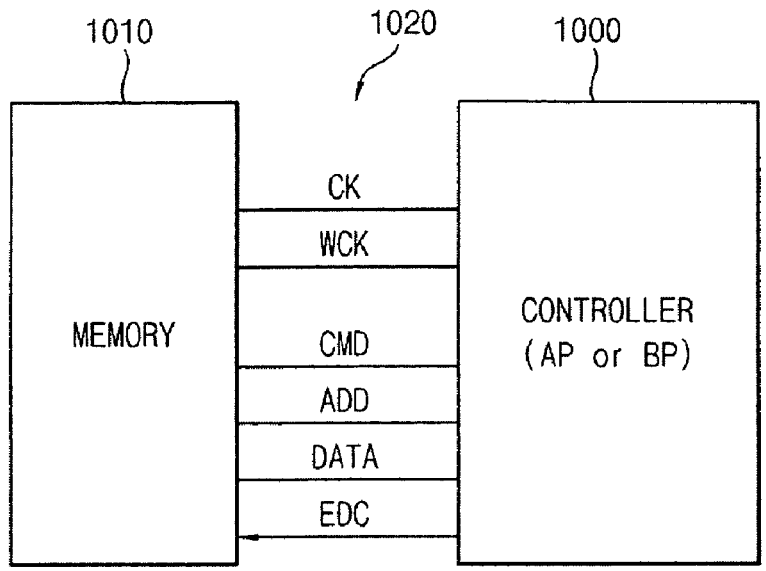
FIG. 21 is a schematic block diagram of a memory controller with skew reduction according to an embodiment of the inventive concept.

FIG. 21 is a schematic block diagram of the memory controller 1000 with skew reduction according to an embodiment of the inventive concept, in which the memory controller 1000 interfaces with a memory circuit 1010 via channels 1020. The block diagram of FIG. 21 illustrates exemplary signals transferred between the controller 1000 and the memory 1010 via the channels 1020. The signals include, for example, clock signal C, write clock signal WCK, command signals CMD, address signals ADD, data signals DATA, and error detection and correction signals EDC.

Figure 22:
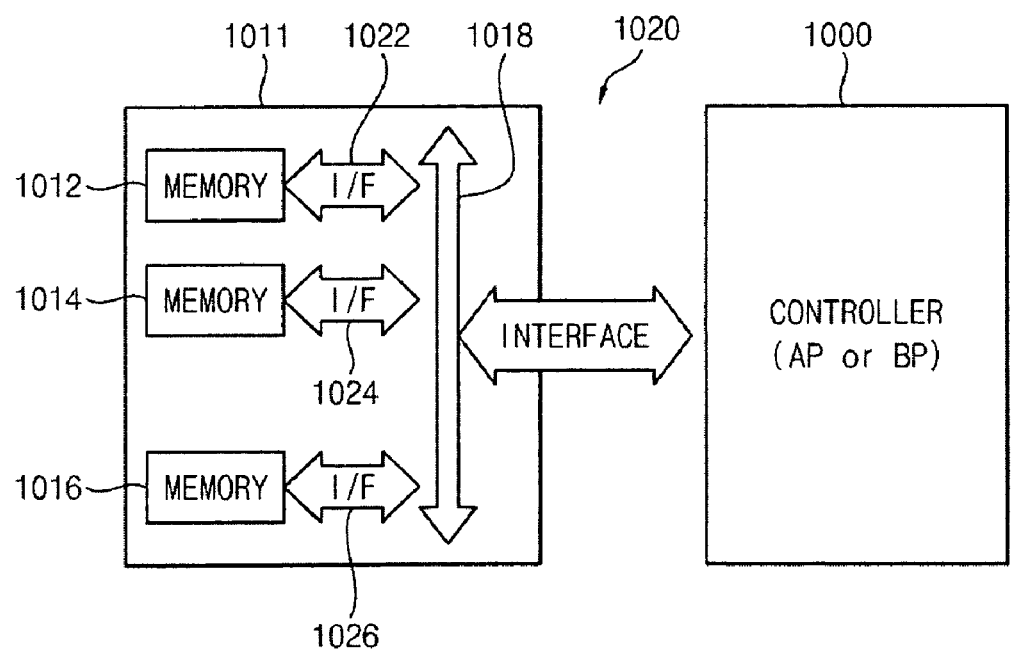
FIG. 22 is a schematic block diagram illustrating a memory system in which a memory controller with skew reduction according to the inventive concept interfaces with and controls multiple memory circuits on a memory module.

According to the inventive concept, the memory controller with the skew reduction capability can interface with multiple memories such as the multiple memories on a memory module, such as a single inline memory module (SIMM) or dual inline memory module (DIMM). FIG. 22 is a schematic block diagram illustrating a memory system in which the memory controller 1000 with skew reduction according to the inventive concept interfaces with and controls multiple memory circuits 1012, 1014, 1016 on a memory module 1011. Referring to FIG. 22, the controller 1000 communicates with the memory circuits over the channels or interface 1020 with reduced skew according to the inventive concept. The module 1011 includes a memory bus 1018 which interfaces with the controller via the channels 102. Each memory 1012, 1014, 1016 interfaces with the memory bus 1018 via bus interfaces 1022, 1024, 1026, respectively.

Figure 23:
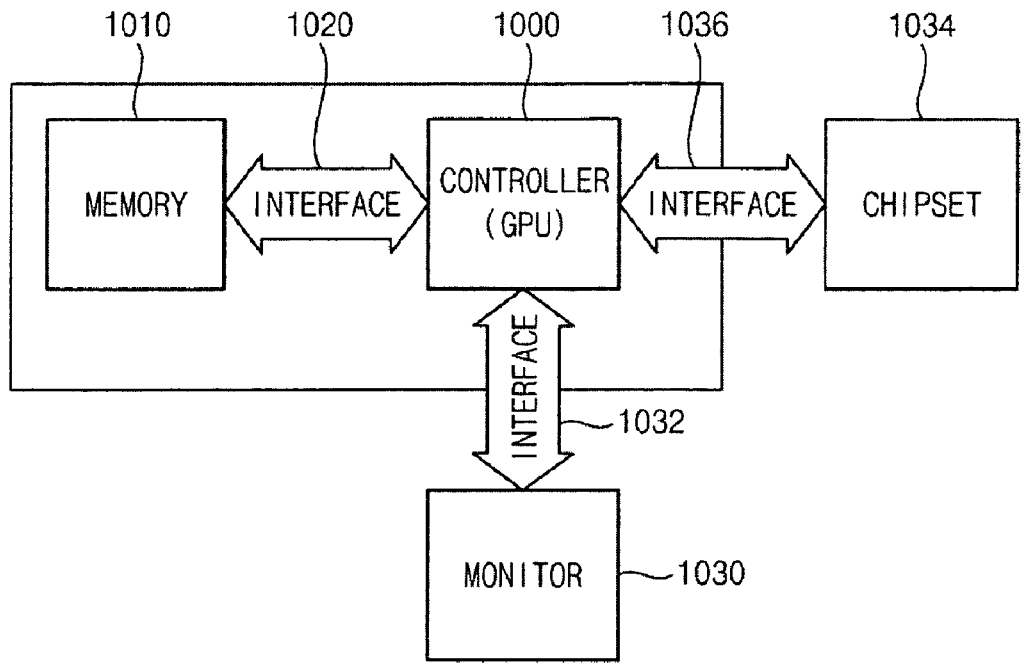
FIG. 23 contains a schematic block diagram of a general processing system in which the memory controller according to the inventive concept can by used.

According to the inventive concept, the memory controller with the skew reduction capability can be used in various processing systems, namely, any system which utilizes controlled memory. For example, FIG. 23 contains a schematic block diagram of a general processing system in which the memory controller 1000 according to the inventive concept can by used. Referring to FIG. 23, the memory controller 1000 communicates with a memory circuit 1010, which can be a single memory circuit or multiple memory circuits such as those on a memory module, over an interface 1020, which includes the channels having reduced skew according to the inventive concept. The controller 1000 can also interface with a user at a monitor via another interface 1032. The controller can also interface with a chipset 1034 via another interface 1036, the chipset containing the circuitry necessary to carry out the function of the system.

Figure 24:
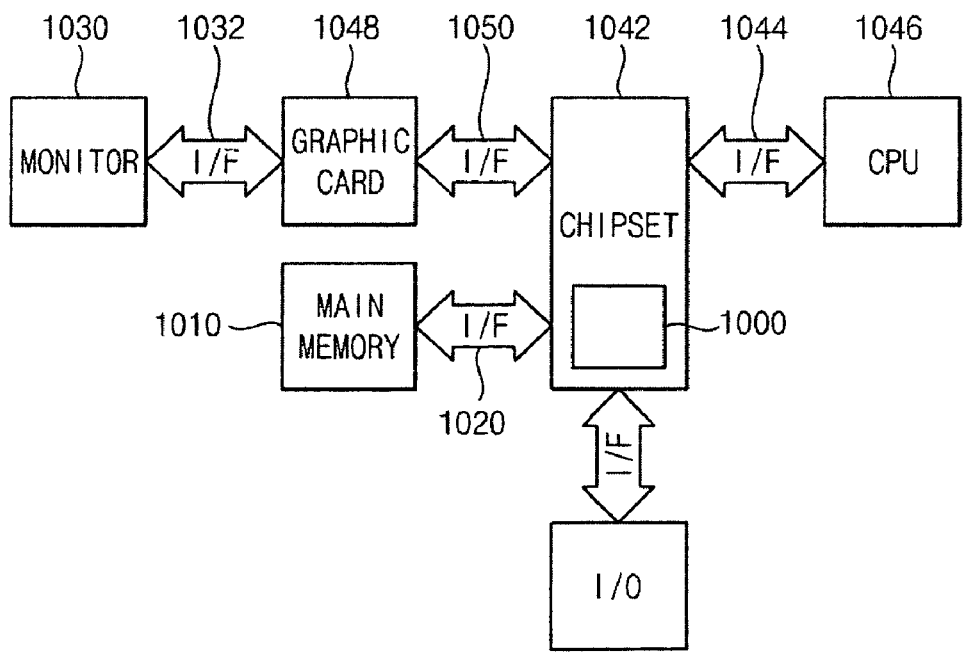
FIG. 24 contains a schematic block diagram of a general purpose computer or processing system using the memory controller with skew reduction according to an embodiment of the inventive concept.

According to the inventive concept, the memory controller with the skew reduction capability can be used in a general computer or processing system. FIG. 24 contains a schematic block diagram of a general purpose computer or processing system using the memory controller with skew reduction according to the inventive concept. Referring to FIG. 24, in this particular exemplary embodiment, the memory controller 1000 of the invention can be included within a chipset 1042. The memory controller 1000 communicates with a memory circuit 1010, which can be a single memory circuit or multiple memory circuits such as those on a memory module, over an interface 1020, which includes the channels having reduced skew according to the inventive concept. The chipset 1042 communicates over another interface 1044 with a CPU 1046 which operates to control the system. The chipset 1042 and or the CPU 1046 communicate with a user via a monitor 1030. Video data for the monitor 1030 is communicated between the chipset 1042 and a graphics card 1048 via an interface 1050. The graphics card 1048 communicates with the monitor 1030 over another interface 1032.

Figure 25:
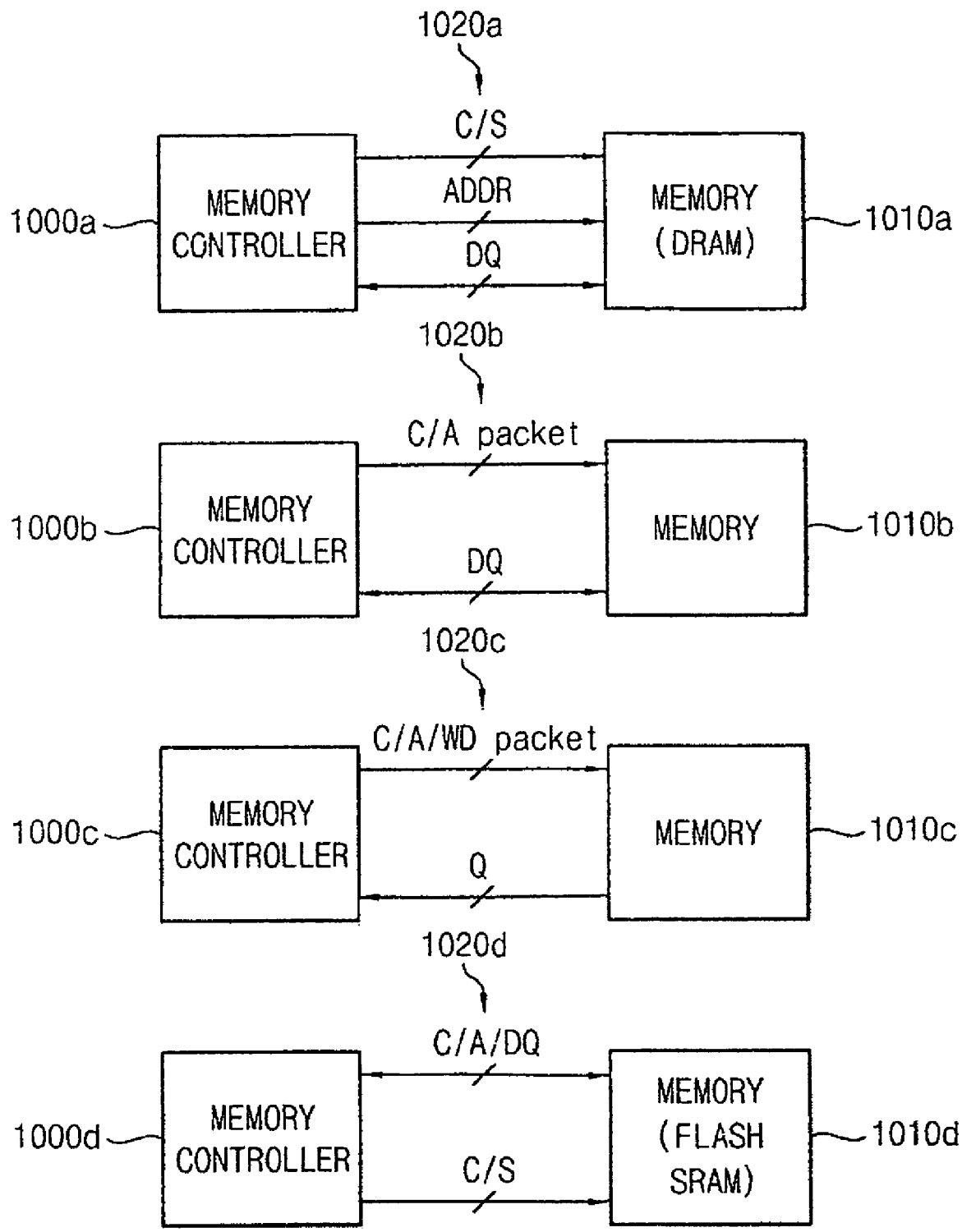
FIG. 25 is a schematic block diagram of a memory controller with skew reduction according to the inventive concept interfaced with multiple various types of memory devices to illustrate various exemplary signals transferred over communication channels with reduced skew, according to the inventive concept.

FIG. 25 is a schematic block diagram of the memory controller with skew reduction according to the inventive concept interfaced with multiple various types of memory devices to illustrate various exemplary signals transferred over communication channels with reduced skew. Referring to FIG. 25, the memory controller 1000 is shown as multiple memory controllers 1000a, 1000b, 1000c, 1000d. The multiple memory controllers 1000a, 1000b, 1000c, 1000d can be a single controller 1000 with circuitry for each interface. The memory controllers 1000a, 1000b, 1000c, 1000d interface with memory devices 1010a, 1010b, 1010c, 1010d, respectively, over interfaces 1020a, 1020b, 1020c, 1020d, respectively, which have the reduced skew according to the inventive concept.

Referring to FIG. 25, the interface 1020a between the memory controller 1000a and the memory device 1010a, which can be, for example, a DRAM device, carries control signals C/S, such as /CS, DKE, /RAS, /CAS, /WE, address signals ADDR and data signals DQ. The interface 1020b between the memory controller 1000b and the memory device 1010b carries C/A packet signals, which are packetized control and address signals, and data DQ signals. The interface 1020c between the memory controller 1000c and the memory device 1010c carries C/A/WD packet signals, which are packetized control and address signals and write data, and Q data signals. The interface 1020d between the memory controller 1000d and the memory device 1010d, which can be a flash SRAM memory device, carries C/A/DQ command, address and data signals, as well as C/S control signals.

Figure 26:
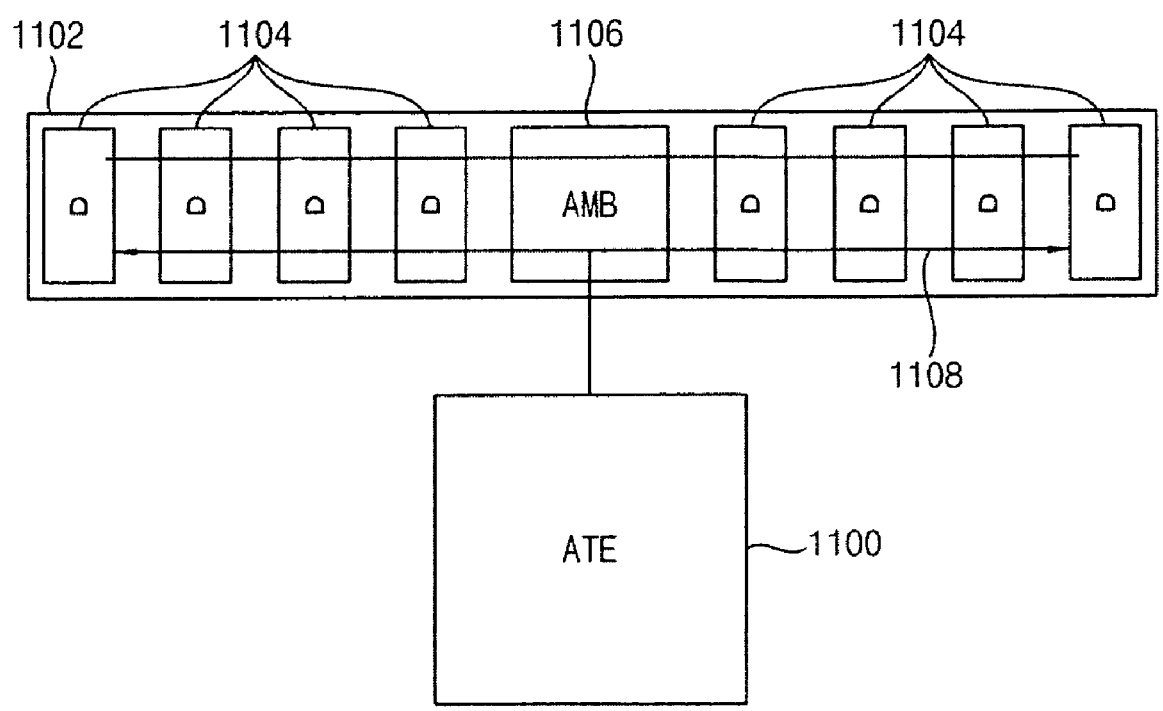
FIG. 26 is a schematic block diagram illustrating a system for testing and/or calibrating a memory system using an AMB, according to an embodiment of the inventive concept.

According to the inventive concept, the memory controller with the skew reduction capability can be used to control memory devices and reduce or eliminate skew in channels using the advanced memory buffer (AMB) configuration. FIG. 26 is a schematic block diagram illustrating a system for testing a memory system using an AMB, according to an embodiment of the inventive concept. Referring to FIG. 26, the system includes ATE 1100, which interfaces with a memory module, such as a fully buffered DIMM (FBDIMM) memory module 1102, for testing the memory devices 1104 on the memory module 1102. The memory devices 1104 can be, for example, DRAM devices. The memory module also includes an AMB unit 1106 which interfaces with the memory devices via a memory bus 1108. The AMB unit 1106 can be equipped with the skew reduction capability of the inventive concept such that skew among the channels on the memory bus is eliminated. The system of FIG. 26 can also be used in a normal memory operating system, i.e., not a testing system using ATE, for timing calibration among communication channels, according to the inventive concept. The operation and control of a conventional FBDIMM system is described in, for example, U.S. Pat. No. 7,343,533, the contents of which are incorporated herein in their entirety by reference.

While the present inventive concept has been particularly shown and described with reference to exemplary embodiments thereof, it will be understood by those of ordinary skill in the art that various changes in form and details may be made therein without departing from the spirit and scope of the present inventive concept as defined by the following claims.

What is claimed is:

1. A circuit configured to correct skew among a plurality of communication channels used in communicating with a memory circuit, comprising:
   a transmitting circuit configured to transmit a reference signal to input ends of the plurality of channels and through the plurality of channels;
   a plurality of receiving circuits configured to receive at the input ends of the plurality of channels a respective plurality of reflected signals, the reflected signals being reflected from respective output ends of the plurality of channels;
   a detection circuit configured to receive the reflected signals and detect relative signal propagation time differences between the plurality of channels; and
   a delay circuit coupled to at least one of the channels between an input of the transmitting circuit and an output of at least one of the plurality of receiving circuits and configured to set a signal propagation delay in the at least one of the channels based on the detected relative signal propagation time differences.

2. The circuit of claim 1, further comprising a plurality of delay circuits coupled to a plurality of the channels configured to set a plurality of signal propagation delays in the plurality of channels based on the detected relative signal propagation time differences.

3. The circuit of claim 1, wherein the reference signal is a step signal.

4. The circuit of claim 1, wherein the circuit is at least one of a built-off-test (BOT) circuit used in sending test signals to the memory circuit and a memory controller circuit for controlling the memory circuit.

5. The circuit of claim 1, wherein the memory circuit is at least one of a device under test (DUT), a DRAM memory circuit, and a DDR3 DRAM memory circuit.

6. The circuit of claim 1, wherein one of the plurality of channels is a channel configured to communicate a DQS data strobe signal.

7. The circuit of claim 6, wherein the delay circuit is set such that a phase shift of 90 degrees is introduced in the channel configured to communicate the DQS data strobe signal.

8. The circuit of claim 1, wherein the delay circuit is at least one of a delay line, a programmable delay line, and an asynchronous programmable delay line.

9. The circuit of claim 1, wherein the transmitting circuit comprises a source termination circuit configured to terminate the input ends of the channels.

10. The circuit of claim 9, wherein the output ends of the channels are configured as open circuits when the signals are transmitted through the channels.

11. The circuit of claim 10, wherein the output ends of the channels are disconnected from the memory circuit when the signals are transmitted through the channels.

12. A memory controller for controlling a memory circuit, the memory controller having a de-skewing capability for correcting skew among a plurality of communication channels used in communicating with the memory circuit, the memory controller comprising:
   a transmitting circuit configured to transmit a reference signal to input ends of the plurality of channels and through the plurality of channels;
   a plurality of receiving circuits configured to receive at the input ends of the plurality of channels a respective plurality of reflected signals, the reflected signals being reflected from respective output ends of the plurality of channels;
   a detection circuit configured to receive the reflected signals and detect relative signal propagation time differences between the plurality of channels; and
   a delay circuit coupled to at least one of the channels between an input of the transmitting circuit and an output of at least one of the plurality of receiving circuits and configured to set a signal propagation delay in the at least one of the channels based on the detected signal propagation time differences.

13. The memory controller of claim 12, further comprising a plurality of delay circuits coupled to a plurality of the channels configured to set a plurality of signal propagation delays in the plurality of channels based on the detected signal propagation time differences.

14. The memory controller of claim 12, wherein the reference signal is a step signal.

15. The memory controller of claim 12, wherein the memory circuit is at least one of a DRAM memory circuit and a DDR3 DRAM memory circuit.

16. The memory controller of claim 12, wherein one of the plurality of channels is a channel configured to communicate a DQS data strobe signal.

17. The memory controller of claim 16, wherein the delay circuit is set such that a phase shift of 90 degrees is introduced in the channel configured to communicate the DQS data strobe signal.

18. The memory controller of claim 12, wherein the transmitting circuit comprises a source termination circuit configured to terminate the input ends of the channels.

19. A method which corrects skew among a plurality of communication channels used in communicating with a memory circuit, comprising:
   transmitting a reference signal to input ends of the plurality of channels and through the plurality of channels;
   receiving at the input ends of the plurality of channels a respective plurality of reflected signals, the reflected signals being reflected from respective output ends of the plurality of channels;
   detecting relative signal propagation time differences between the plurality of channels; and
   setting a signal propagation delay in at least one of the channels based on the detected relative signal propagation time differences, wherein setting the signal propagation delay comprises:
      performing coarse tuning by adjusting a delay in a channel configured to communicate a DQS data strobe signal to be aligned with at least one channel configured to communicate a data signal, and
      after performing the coarse tuning, performing fine tuning by adjusting a delay in at least one other channel configured to communicate a data signal to be aligned with the channel configured to communicate the DQS data strobe signal.

20. The method of claim 19, further comprising setting a plurality of signal propagation delays in the plurality of channels based on the detected relative signal propagation time differences.

* * * * *